United States Patent
Kim et al.

(10) Patent No.: US 10,481,728 B2
(45) Date of Patent: *Nov. 19, 2019

(54) DISPLAY DEVICE COMPRISING TOUCH SENSOR

(71) Applicant: Samsung Display Co., Ltd., Yongin-si, Gyeonggi-do (KR)

(72) Inventors: Min Soo Kim, Yongin-si (KR); Mu Gyeom Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 82 days.

This patent is subject to a terminal disclaimer.

(21) Appl. No.: 15/798,162

(22) Filed: Oct. 30, 2017

(65) Prior Publication Data

US 2018/0120975 A1    May 3, 2018

(30) Foreign Application Priority Data

Nov. 2, 2016   (KR) .......................... 10-2016-0145131

(51) Int. Cl.
*G06F 3/041*   (2006.01)
*G06F 3/044*   (2006.01)
(Continued)

(52) U.S. Cl.
CPC ........ *G06F 3/04164* (2019.05); *G02F 1/1345* (2013.01); *G02F 1/13338* (2013.01);
(Continued)

(58) Field of Classification Search
CPC ...... G06F 3/041; G06F 3/0412; G06F 3/0416; G06F 3/044; G06F 2203/04102;
(Continued)

(56) References Cited

U.S. PATENT DOCUMENTS 8,259,089 B2    9/2012    Lee et al.
8,946,690 B2    2/2015    Lee et al.
(Continued)

FOREIGN PATENT DOCUMENTS

KR           10-1450256 B1    10/2014
KR       10-2015-0116985 A    10/2015
(Continued)

OTHER PUBLICATIONS

EPO Extended Search Report dated Apr. 5, 2018, for corresponding European Patent Application No. 17199619.2 (10 pages).

*Primary Examiner* — Nathan Danielsen
(74) *Attorney, Agent, or Firm* — Lewis Roca Rothgerber Christie LLP

(57) ABSTRACT

A display device includes: a first substrate including a display area including a pixel area and a non-display area adjacent to the display area, the first substrate including a connection pad disposed in the non-display area; and a second substrate opposite to the first substrate, the second substrate including a base substrate including a sensing area corresponding to the display area and a non-sensing area corresponding to the non-display area, and a touch sensor disposed on the base substrate, wherein the touch sensor includes a touch sensing electrode disposed in the sensing area, a touch pad disposed in the non-sensing area, and a sensing line electrically connecting the touch sensing electrode and the touch pad, wherein the non-sensing area of the second substrate is bent such that the connection pad and the touch pad are opposite to each other.

31 Claims, 17 Drawing Sheets

(51) Int. Cl.
*G02F 1/1345* (2006.01)
*H01L 27/32* (2006.01)
*H01L 51/52* (2006.01)
*G02F 1/1333* (2006.01)
*H01L 51/00* (2006.01)

(52) U.S. Cl.
CPC ........ *G02F 1/133305* (2013.01); *G06F 3/044* (2013.01); *G06F 3/0416* (2013.01); *G06F 3/0446* (2019.05); *G06F 3/0448* (2019.05); *H01L 27/323* (2013.01); *H01L 27/3276* (2013.01); *H01L 51/0097* (2013.01); *H01L 51/5281* (2013.01); *G06F 2203/04102* (2013.01); *G06F 2203/04103* (2013.01); *G06F 2203/04111* (2013.01); *G06F 2203/04112* (2013.01)

(58) Field of Classification Search
CPC . G06F 2203/04103; G06F 2203/04111; G06F 2203/04112; G02F 1/133305; G02F 1/13338; G02F 1/1345–1/13454; G02F 1/13458; G02F 2001/13456; H01L 27/323; H01L 27/3276; H01L 51/0097; H01L 51/5281; H01L 51/5284
See application file for complete search history.

(56) References Cited

U.S. PATENT DOCUMENTS

| | | |
|---|---|---|
| 9,196,876 B2 | 11/2015 | Lee et al. |
| 9,400,580 B2 | 7/2016 | Lim |
| 2011/0012845 A1 | 1/2011 | Rothkopf et al. |
| 2011/0095770 A1* | 4/2011 | Kurashima ............. G06F 3/044 324/679 |
| 2013/0194759 A1 | 8/2013 | Kang et al. |
| 2014/0043569 A1* | 2/2014 | Yabuta ................ G02F 1/13338 349/104 |
| 2014/0203703 A1* | 7/2014 | Maatta ................ G02F 1/13452 313/504 |
| 2014/0217382 A1* | 8/2014 | Kwon ................. H01L 51/0097 257/40 |
| 2015/0286325 A1 | 10/2015 | Kim |
| 2016/0043154 A1 | 2/2016 | Choi et al. |
| 2016/0195969 A1 | 7/2016 | Kim et al. |
| 2016/0231846 A1 | 8/2016 | Kim et al. |
| 2016/0268524 A1 | 9/2016 | Suzuki et al. |
| 2016/0268542 A1* | 9/2016 | Suzuki .................... G06F 3/041 |
| 2016/0306460 A1 | 10/2016 | Lee et al. |

FOREIGN PATENT DOCUMENTS

| | | |
|---|---|---|
| KR | 10-2015-0136732 A | 12/2015 |
| KR | 10-2016-0017338 A | 2/2016 |
| KR | 10-2016-0017388 A | 2/2016 |
| KR | 10-2016-0123437 A | 10/2016 |

* cited by examiner

DISPLAY DEVICE COMPRISING TOUCH SENSOR

CROSS-REFERENCE TO RELATED APPLICATION

The present application claims priority to and the benefit of Korean Patent Application No. 10-2016-0145131, filed on Nov. 2, 2016, in the Korean Intellectual Property Office, the entire content of which is incorporated by reference herein.

BACKGROUND

1. Field

An aspect of an embodiment of the present disclosure relates to a display device.

2. Description of the Related Art

Recently, display devices have been developed to include an information input function along with an image display function. The information input function of the display devices may be generally implemented as a touch screen for receiving user input. The touch screen is attached to one surface of a display panel that implements the image display function, or is integrally formed with the display panel.

In a display device having the touch screen, the touch screen is disposed to be spaced apart from one substrate of the display panel, e.g., a substrate on which a signal input terminal is disposed. The display device may electrically connect the touch screen and the signal input terminal using an anisotropic conductive film (ACF) including a conductive ball.

The conductive ball should have a size corresponding to a distance between the touch screen and the substrate. Therefore, the size of the conductive ball may increase, and a variation in size of the conductive ball may remarkably increase as the size of the conductive ball increases. The variation in size of the conductive ball may cause a contact failure between the touch screen and the signal input terminal.

SUMMARY

Embodiments provide a display device capable of preventing a failure caused by a variation in size of a conductive ball (or capable of reducing a likelihood or degree of such failure).

According to an aspect of the present disclosure, there is provided a display device including: a first substrate including a display area including a pixel area and a non-display area adjacent to the display area, the first substrate including a connection pad disposed in the non-display area; and a second substrate facing to the first substrate, the second substrate including a base substrate including a sensing area corresponding to the display area and a non-sensing area corresponding to the non-display area, and a touch sensor disposed on the base substrate, wherein the touch sensor includes a touch sensing electrode disposed in the sensing area, a touch pad disposed in the non-sensing area, and a sensing line electrically connecting the touch sensing electrode and the touch pad, wherein the non-sensing area of the second substrate is bent such that the connection pad and the touch pad face to each other.

The touch sensing electrode and the touch pad may be provided on the same surface of the base substrate.

The display device may further include a conductive ball disposed between the connection pad and the touch pad.

The display device may further include a protruding bump protruding toward the connection pad from the touch pad to connect the connection pad and the touch pad.

The display device may further include a conductive adhesive layer disposed between the connection pad and the touch pad.

The conductive adhesive layer may include a conductive paste.

The connection pad and the touch pad may be in direct contact with each other.

The display device may further include an elastic member disposed between areas of the second substrate, which face to each other as the second substrate is bent, to maintain the bent shape of the second substrate.

The display device may further include a polarizing layer disposed on one surface of the second substrate.

The polarizing layer may be disposed on an outer surface of the second substrate.

The display device may further include a polarizing layer disposed between the first substrate and the second substrate.

A through-hole passing through the base substrate may be provided in the non-sensing area. The touch pad may include: a first pattern provided on a surface of the base substrate, on which the touch sensing electrode and the sensing line are disposed; a second pattern provided in the through-hole, the second pattern being connected to the first pattern; and a third pattern provided on a surface opposite to the surface of the base substrate, on which the first pattern is provided, the third pattern being connected to the second pattern.

When the second substrate is bent, the sensing line and the first pattern may face to each other, and the connection pad and the third pattern may face to each other.

The display device may further include a conductive ball disposed between the connection pad and the third pattern.

The display device may further include a conductive ball disposed between the sensing line and the first pattern.

The sensing line and the first pattern may be in direct contact with each other.

The display device may further include a conductive adhesive layer disposed between the connection pad and the third pattern.

The display device may further include a conductive adhesive layer disposed between the sensing line and the first pattern.

A through-hole passing through the base substrate may be provided in the non-sensing area. The touch pad may include: a first pattern having a shape in which the sensing line extends; a second pattern provided in the through-hole, the second pattern being connected to the first pattern; and a third pattern provided on a surface opposite to the surface of the base substrate, on which the first pattern is provided, the third pattern being connected to the second pattern.

When the second substrate is bent, the sensing line and the first pattern may face to each other. The display device may further include an elastic member disposed between the sensing line and the first pattern.

When the second substrate is bent, the sensing line and the first pattern may face to each other. The display device may further include: a supporting member disposed between the sensing line and the first pattern; and a supporting member adhesive layer provided between the sensing line and the supporting member and between the first pattern and the supporting member.

The touch sensing electrode and the touch pad may be provided on different surfaces of the base substrate, respectively.

The sensing line may include: a first sensing line provided on a surface of the base substrate, on which the touch sensing electrode is disposed; and a second sensing line provided on a surface of the base substrate, on which the touch pad is disposed.

The display device may further include a metal pattern connecting the first sensing line and the second sensing line. The metal pattern may include: a first pattern provided on a surface of the base substrate, on which the first sensing line is disposed; a second pattern provided in a through-hole passing through the base substrate, the second pattern being connected to the first pattern; and a third pattern provided on a surface of the base substrate, on which the second sensing line is disposed, the third pattern being connected to the second pattern.

The display device may further include a cover layer covering the touch sensing electrode and the sensing line.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
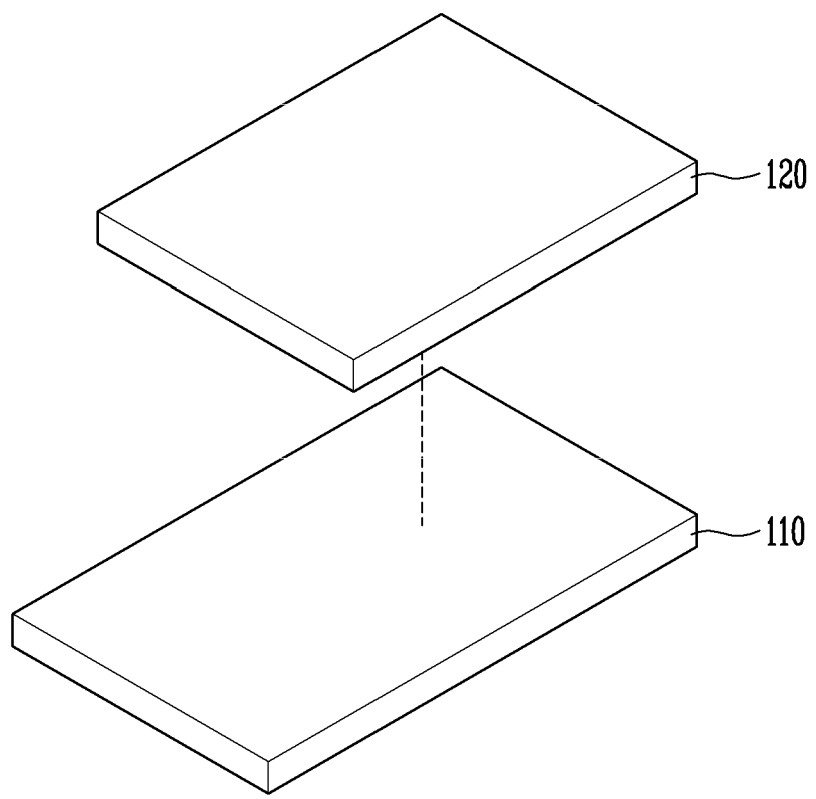
FIG. 1 is a perspective view illustrating a display device according to an embodiment of the present disclosure.

The present disclosure may apply various changes and different shapes to the disclosed subject matter, and illustrates details of embodiments of the disclosure with particular examples. However, the present disclosure is not limited to certain shapes but encompasses all suitable changes and equivalent materials and replacements. The accompanying drawings are illustrated in a fashion where the illustrated subject matter may be expanded for a better understanding of the illustrated subject matter.

In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the spirit and scope of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. Additionally, an expression that an element such as a layer, region, substrate or plate is placed "beneath" or "below" another element indicates not only a case where the element is placed "directly beneath" or "just below" the other element but also a case where a further element is interposed between the element and the other element. It will also be understood that when an element or layer is referred to as being "connected to" another element or layer, it can be directly connected to (or coupled to) the other element or layer, or one or more intervening elements or layers may be present.

Hereinafter, exemplary embodiments of the present disclosure will be described in more detail with reference to the accompanying drawings.

Figure 2:
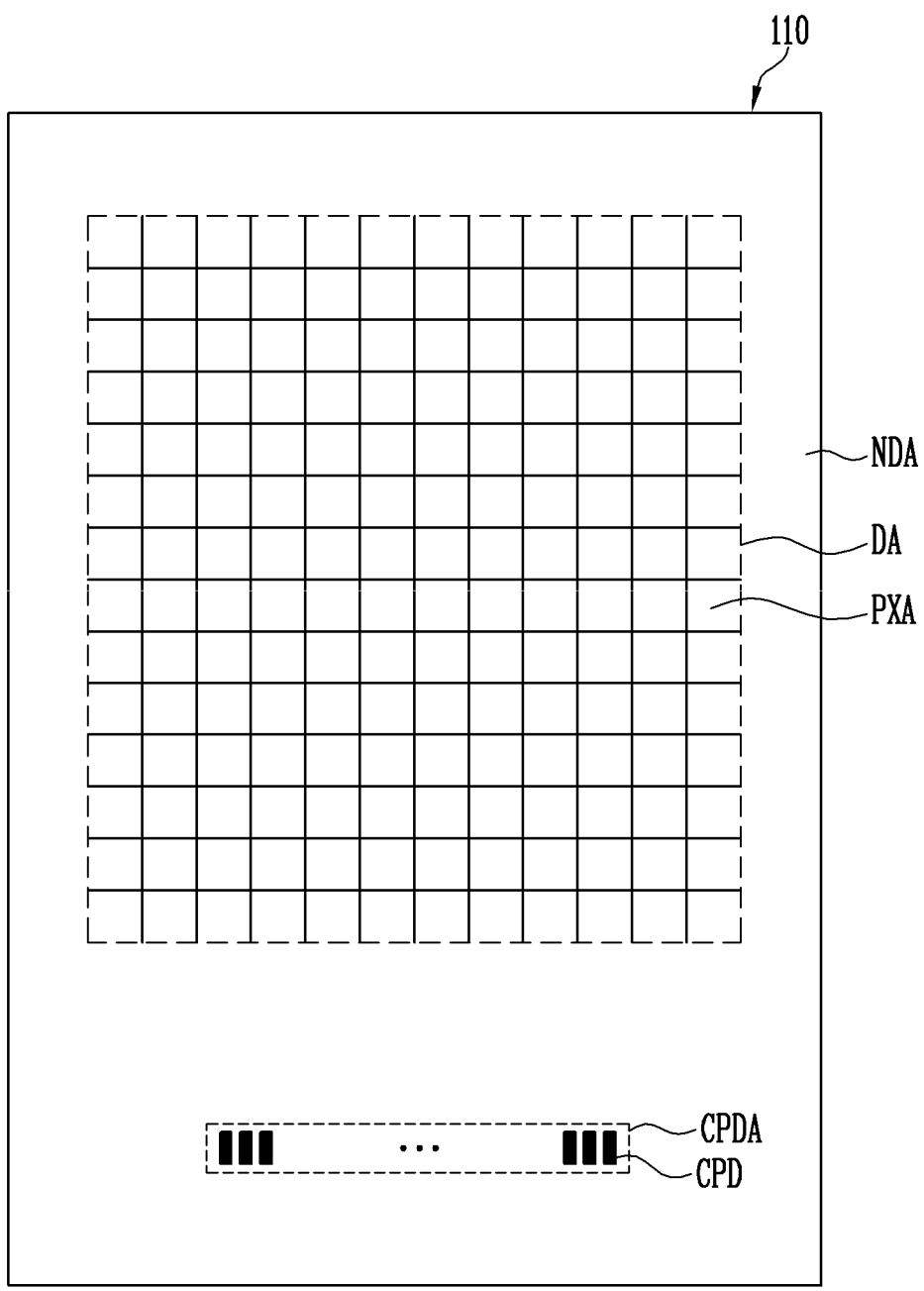
FIG. 2 is a plan view illustrating a display panel of FIG. 1.
Figure 3:
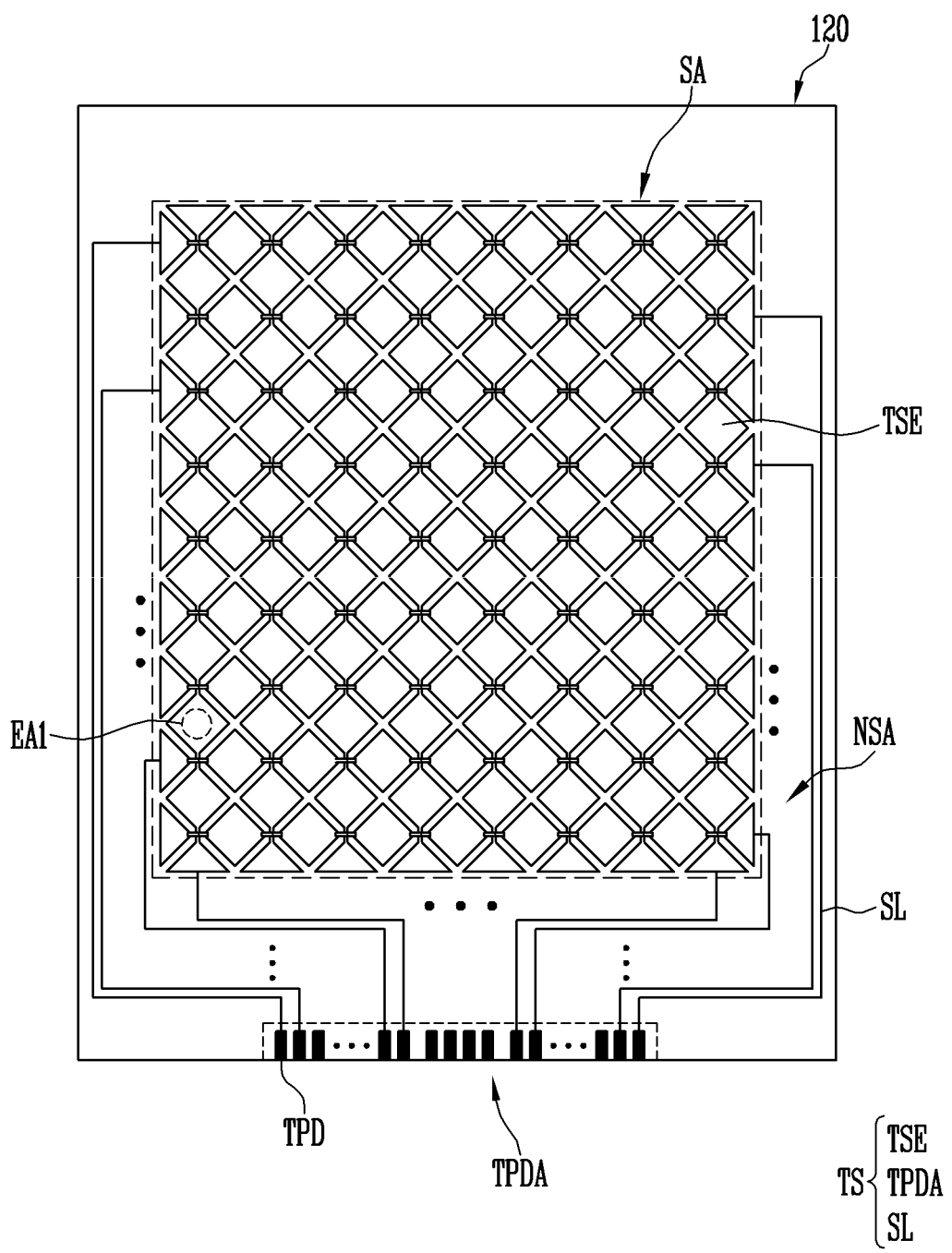
FIGS. 3-4 are plan views illustrating a touch sensor of FIG. 1.
Figure 4:
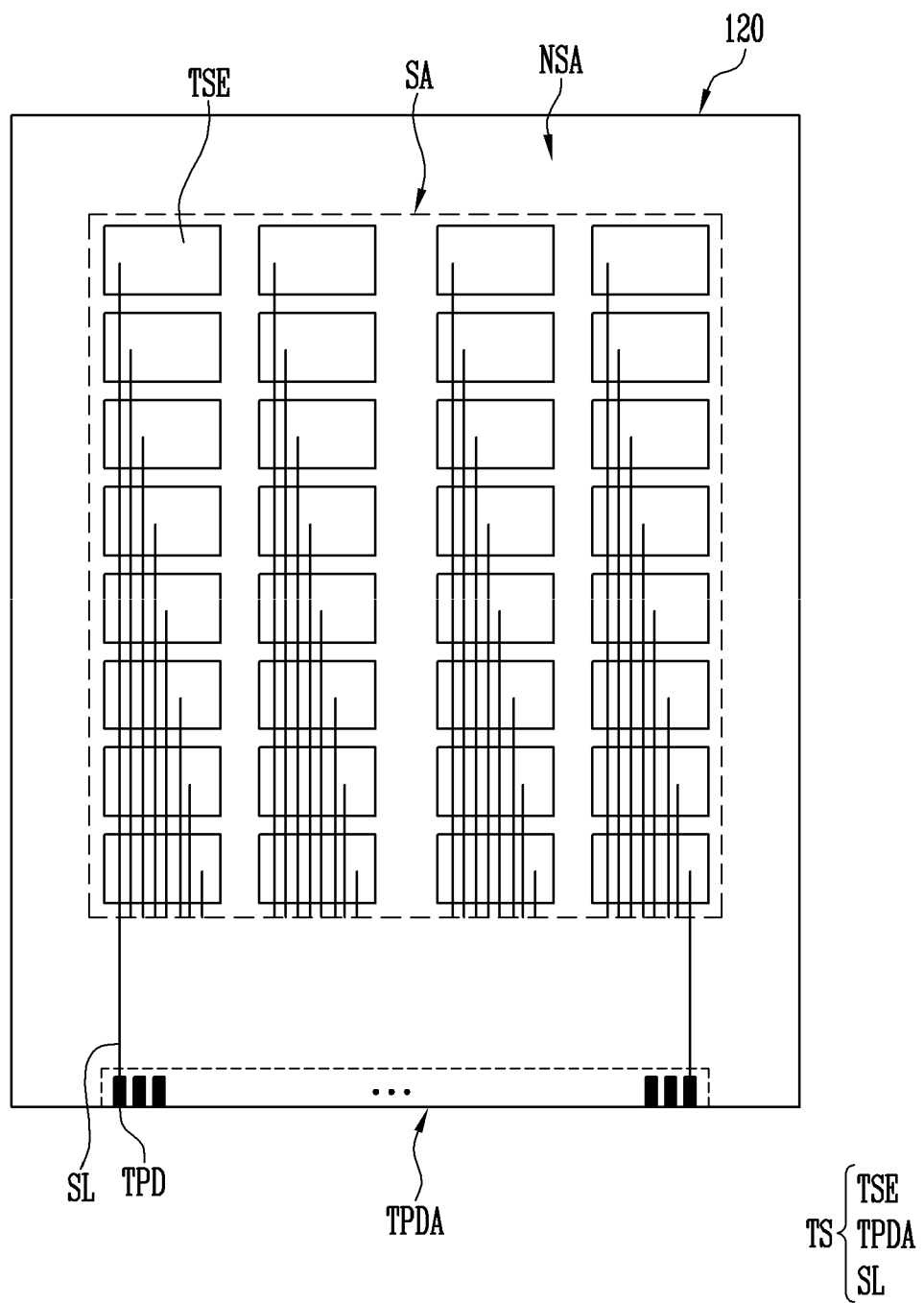
Figure 5:
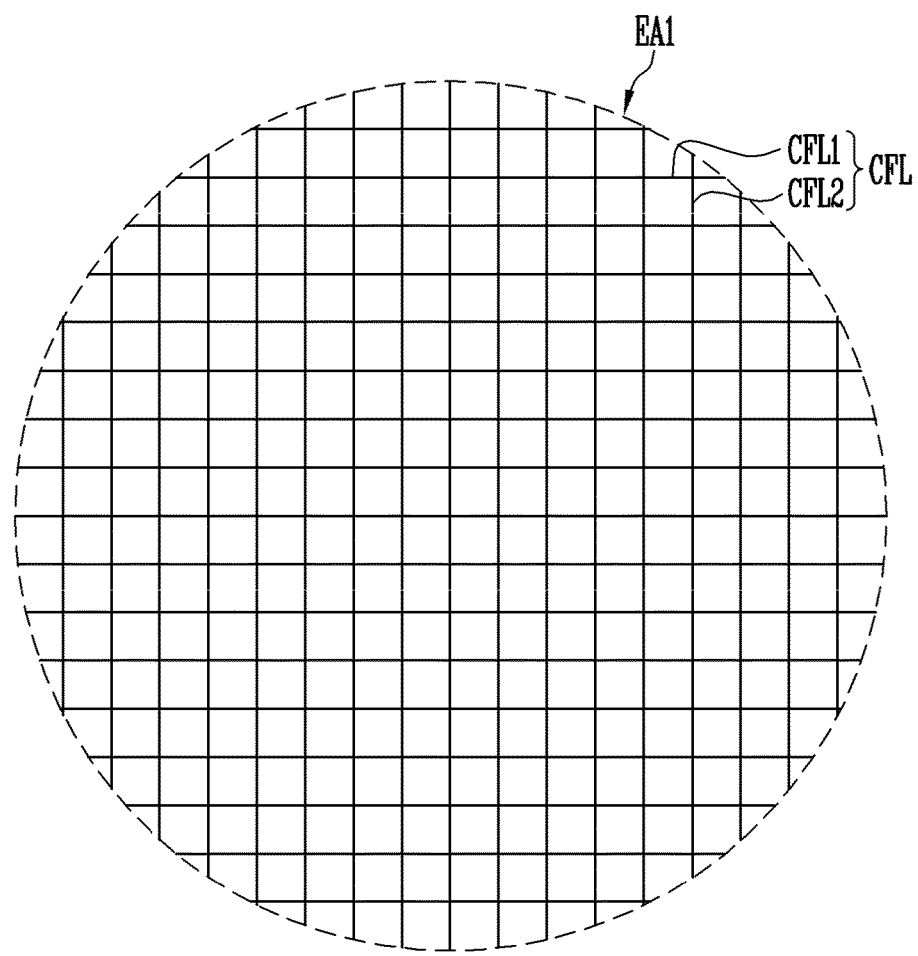
FIG. 5 is an enlarged view of area EA1 of FIG. 3.

FIG. 1 is a perspective view illustrating a display device according to an embodiment of the present disclosure. FIG. 2 is a plan view illustrating a display panel of FIG. 1. FIGS. 3-4 are plan views illustrating a touch sensor of FIG. 1. FIG. 5 is an enlarged view of area EA1 of FIG. 3.

Referring to FIGS. 1-5, the display device may include a first substrate 110 and a second substrate 120 facing the first substrate 110.

The first substrate 110 may include a display area DA and a non-display area NDA.

A plurality of pixel areas PXA may be provided in the display area DA. In addition, a plurality of gate lines, a plurality of data lines intersecting the gate lines may be provided in the display area DA. At least one thin film transistor connected to one of the gate lines and the data lines and a display element connected to the thin film transistor may be disposed in each of the pixel areas PXA.

The display element may be any one selected from a liquid crystal display element (LCD element), an electrophoretic display element (EPD element), an electrowetting display element (EWD element), and an organic light emitting display element (OLED element). Meanwhile, hereinafter, for convenience of illustration, the OLED element is described as an example of the display element, but the present disclosure is not limited thereto.

The display element may include a first electrode connected to the thin film transistor, an emitting layer disposed on the first electrode, and a second electrode disposed on the emitting layer. The emitting layer may generate light by recombination of electrons and holes injected through the first electrode and the second electrode.

The non-display area NDA may be disposed adjacent to the display area DA. For example, the non-display area NDA may have a shape surrounding the display area DA at the outside of the display area DA. In addition, a connection pad unit CPDA in which a plurality of connection pads are disposed may be disposed at a portion of the non-display area NDA.

The second substrate 120 may be provided with a touch sensor TS. Also, the second substrate 120 may include a sensing area SA and a non-sensing area NSA. The sensing area SA may correspond to the display area DA of the first substrate 110. The non-sensing area NSA may be disposed adjacent to the sensing area SA. Also, the non-sensing area NSA may correspond to the non-display area NSA of the first substrate 110.

The touch sensor TS may be provided on one surface of the second substrate 120.

The touch sensor TS may include a plurality of touch sensing electrodes TSE, a touch pad unit TPDA including a plurality of touch pads TPD, and sensing lines SL connecting the touch sensing electrodes TSE and the touch pads TPD.

The touch sensing electrodes TSE may be disposed in various forms according to a touch sensing type (or kind) of the touch sensor TS.

For example, as shown in FIG. 3, the touch sensing type (or kind) of the touch sensor TS may be a mutual capacitance touch sensor type (or kind). Here, some of the touch sensing electrodes TSE may constitute a plurality of touch sensing electrode rows connected in the one direction, the plurality of touch sensing electrode rows being parallel or substantially parallel to one another. In addition, the rest of the touch sensing electrodes TSE may constitute a plurality of touch sensing electrode columns connected in a direction intersecting the touch sensing electrode rows, the plurality of touch sensing electrode columns being parallel or substantially parallel to one another. The touch sensing electrode rows and the touch sensing electrode columns may be connected to the touch pads TPD of the touch pad unit TPDA through the sensing lines SL, respectively.

In addition, as shown in FIG. 4, the touch sensing type (or kind) of the touch sensor TS may be a self capacitance touch sensor type (or kind). Here, the touch sensing electrodes TSE may be arranged in a matrix form. The touch sensing electrodes TSE may be connected to the touch pads TPD of the touch pad unit TPDA through the sensing lines SL, respectively.

The touch sensing electrodes TSE may include a conductive material. For example, the touch sensing electrodes TSE may include at least one transparent conductive oxide among indium tin oxide (ITO), indium zinc oxide (IZO), gallium doped zinc oxide (GZO), zinc tin oxide (ZTO), gallium tin oxide (GTO), and fluorine doped tin oxide (FTO).

Also, the touch sensing electrodes TSE, as shown in FIG. 5, a plurality of conductive fine lines CFL. For example, the touch sensing electrodes TSE may include a plurality of first conductive fine lines CFL1 extending in one direction, the plurality of first conductive fine lines CFL being parallel or substantially parallel to one another, and a plurality of second conductive fine lines CFL2 extending in a direction intersecting the first conductive fine lines CFL1, the plurality of second conductive fine lines CFL2 being parallel or substantially parallel to one another. In some embodiments, the touch sensing electrodes TSE may have a mesh structure. The mesh structure may be suitable for implementing a bendable, foldable, or rollable touch sensor.

The first conductive fine lines CFL1 and the second conductive fine lines CFL2 may include a low-resistance metal. For example, the first conductive fine lines CFL1 and the second conductive fine lines CFL2 may include at least one selected from gold (Au), silver (Ag), copper (Cu), molybdenum (Mo), aluminum (Al), palladium (Pd), neodymium (Nd), and a silver-palladium-copper alloy (APC).

The touch pads TPD and the sensing lines SL may be provided in the non-sensing area NSA.

The touch pads TPD may be electrically connected to the connection pads CPD. Thus, the touch pads TPD can apply a touch driving signal supplied from the outside to the touch sensor TS through the connection pads CPD and transmit a touch sensing signal sensed by the touch sensor TS to the outside.

Figure 6:
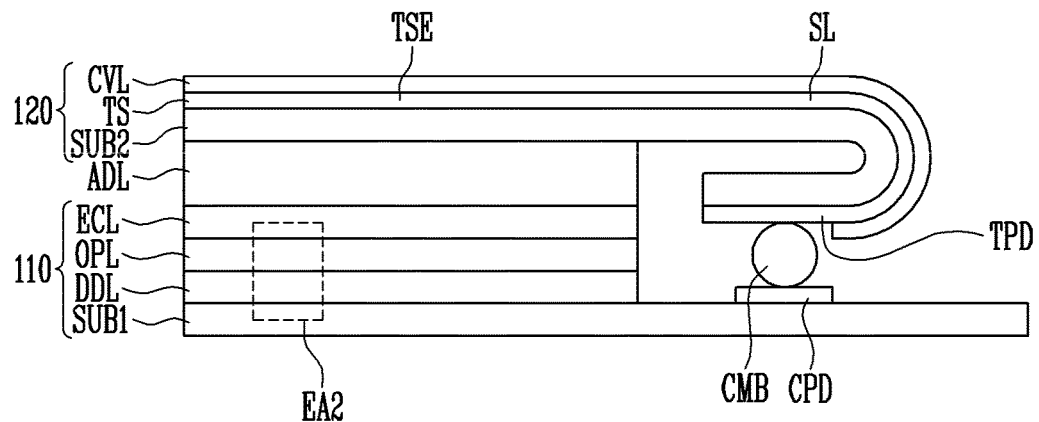
FIG. 6 is a partial sectional view of the display device shown in FIGS. 1-5.
Figure 7:
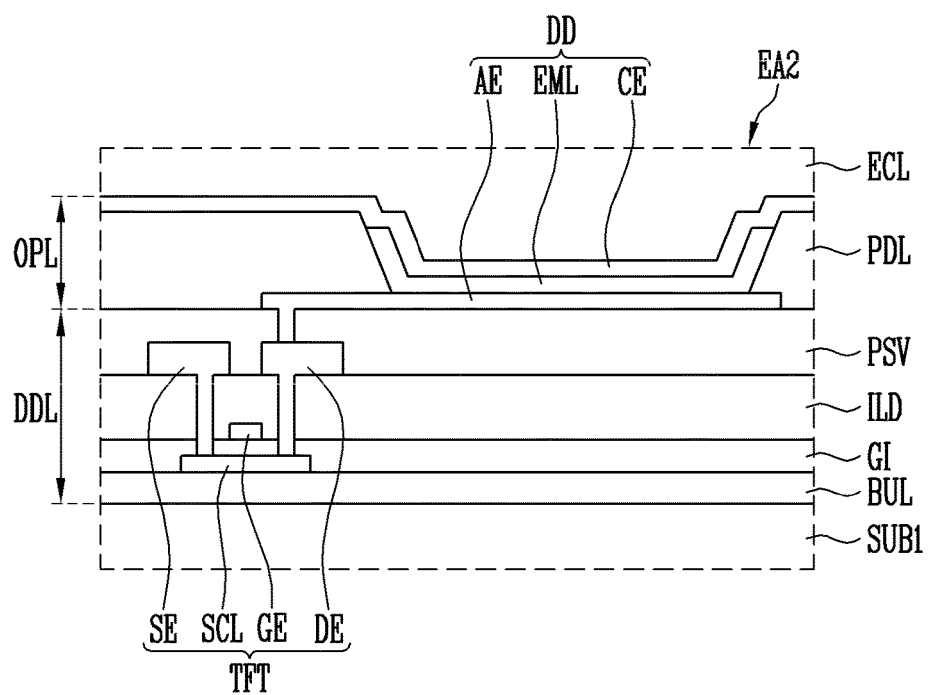
FIG. 7 is an enlarged view of area EA2 of FIG. 6.

FIG. 6 is a partial sectional view of the display device shown in FIGS. 1-5. FIG. 7 is an enlarged view of area EA2 of FIG. 6.

Referring to FIGS. 1-7, the display device may include a first substrate 110, a second substrate 120 facing the first substrate 110, and an adhesive layer ADL joining the first substrate 110 and the second substrate 120 together.

The first substrate 110 may include a first base substrate SUB1, a driving layer DDL provided on the first base substrate SUB1, an optical layer OPL provided on the driving layer DDL, and an encapsulating layer ECL provided on the optical layer OPL.

The first base substrate SUB1 may include a display area DA and a non-display area NDA. A plurality of pixel areas PXA may be provided in the display area DA. The non-display area NDA may be disposed adjacent to the display area DA.

The first base substrate SUB1 may include a transparent insulating material to enable light to be transmitted therethrough. Also, the first base substrate SUB1 may be a rigid substrate or flexible substrate. The rigid substrate may include a glass substrate, a quartz substrate, a glass ceramic substrate, and/or a crystalline glass substrate. The flexible substrate may be one of a film base substrate including a polymer organic material and a plastic base substrate. For example, the flexible substrate may include at least one selected from polyethersulfone (PES), polyacrylate (PA), polyetherimide (PEI), polyethylene naphthalate (PEN), polyethylene terephthalate (PET), polyphenylene sulfide (PPS), polyarylate (PAR), polyimide (PI), polycarbonate (PC), cellulose triacetate (TAC), and cellulose acetate propionate (CAP). Also, the flexible substrate may include a fiber glass reinforced plastic (FRP).

In some embodiments, the material applied to the first base substrate SUB1 has resistance (or heat resistance) against high processing temperature in a fabricating process of the display device.

The driving layer DDL is provided on the first base substrate SUB1, and may include at least one thin film transistor TFT provided in each pixel area PXA. Also, the driving layer DDL may include a buffer layer BUL provided between the first base substrate SUB1 and the thin film transistor TFT. The buffer layer BUL may include an inorganic insulating material. For example, the buffer layer BUL may include at least one selected from silicon oxide, silicon nitride, and silicon oxynitride. Also, the buffer layer BUL may have a single-layered or multi-layered structure. For example, the buffer layer BUL may have a single-layered structure including at least one selected from silicon oxide, silicon nitride, and silicon oxynitride. The buffer layer BUL may include a first insulating layer including silicon oxide, and a second insulating layer disposed on the first insulating layer, the second insulating layer including silicon nitride. The buffer layer BUL may include three or more insulating layers that are sequentially stacked.

The buffer layer BUL may prevent impurities from being diffused from the first base substrate SUB1 to the thin film transistor TFT (or may reduce such diffusion of the impurities). Also, the buffer layer BUL may planarize a surface of the first base substrate SUB1.

The thin film transistor TFT may be a gate line and a data line. The thin film transistor TFT may include a semiconductor layer SCL, a gate electrode GE, a source electrode SE, and a drain electrode DE.

The semiconductor layer SCL may be disposed on the buffer layer BUL. The semiconductor layer SCL may include at least one selected from amorphous Si, polycrystalline Si, oxide semiconductor, and organic semiconductor. In the semiconductor layer SCL, regions connected to the source electrode SE and the drain electrode DE may be a source region and a drain region into which impurities are doped or injected. A region between the source region and the drain region may be a channel region.

Meanwhile, in some embodiments, such as the one shown in FIG. 7, when the semiconductor layer SCL includes an oxide semiconductor, a light blocking layer for blocking light incident into the semiconductor layer SCL may be disposed on the top or bottom of the semiconductor layer SCL.

A gate insulating layer GI may be disposed over the semiconductor layer SCL. The gate insulating layer GI covers the semiconductor layer SCL, and may insulate the semiconductor layer SCL and the gate electrode GE from each other. The gate insulating layer GI may include at least one selected from an organic insulating material and an inorganic insulating material. For example, the gate insulating layer GI may include at least one selected from silicon oxide and silicon nitride.

The gate electrode GE may be disposed on the gate insulating layer GI. The gate electrode GE may be connected to the gate line. The gate electrode GE may include a low-resistance conductive material. The gate electrode GE may overlap with the semiconductor layer SCL.

An interlayer insulating layer ILD may be disposed over the gate electrode GE. The interlayer insulating layer ILD may include at least one selected from an organic insulating material and an inorganic insulating material. For example, the interlayer insulating layer ILD may include at least one selected from silicon oxide and silicon nitride. The interlayer insulating layer ILD may insulate the source electrode SE and the drain electrode DE from the gate electrode GE.

Contact holes passing through the gate insulating layer GI and the interlayer insulating layer ILD may expose the source region and the drain region of the semiconductor layer therethrough.

The source electrode SE and the drain electrode DE may be disposed on the interlayer insulating layer ILD to be spaced apart from each other. The source electrode SE and the drain electrode DE may include a low-resistance conductive material. One end of the source electrode SE may be connected to the data line. The other end of the source electrode SE may be connected to the source region through one of the contact holes. One end of the drain electrode DE may be connected to the drain region through the other of the contact holes. The other end of the drain electrode DE may be connected to a display element DD.

Meanwhile, in this embodiment, a case where the thin film transistor TFT is a thin film transistor having a top gate structure has been described as an example, but the present disclosure is not limited thereto. For example, the thin film transistor TFT may be a thin film transistor having a bottom gate structure.

The driving layer DDL may include a protective layer (PSV) covering the thin film transistor TFT. The protective layer PSV may be provided on the first base substrate SUB1 on which the thin film transistor TFT is disposed. A portion of the protective layer PSV may be removed to expose one of the source electrode SE and the drain electrode DE, e.g., the drain electrode DE therethrough.

The protective layer PSV may include at least one layer. For example, the protective layer PSV may include an inorganic protective layer and an organic protective layer disposed on the inorganic protective layer. The inorganic protective layer may include at least one selected from silicon oxide and silicon nitride. The organic protective layer may include at least one selected from acryl, polyimide (PI), polyamide (PA), and benzocyclobutene (BCB). Also, the organic protective layer may be a planarization layer that is transparent and flexible to reduce and planarize winding of a lower structure.

The optical layer OPL is provided on the protective layer PSV, and may include the display element DD connected to the drain electrode DE.

The display element DD may include a first electrode AE connected to the drain electrode DE, an emitting layer EML disposed on the first electrode AE, and a second electrode CE disposed on the emitting layer EML.

One of the first electrode AE and the second electrode CE may be an anode electrode, and the other of the first electrode AE and the second electrode CE may be a cathode electrode. For example, the first electrode AE may be an anode electrode, and the second electrode CE may be a cathode electrode.

In addition, at least one selected from the first electrode AE and the second electrode CE may be a transmissive electrode. For example, when the display element DD is a bottom emission type (or kind) of organic light emitting element, the first electrode AE may be a transmissive electrode, and the second electrode CE may be a reflective electrode. When the display element DD is a top emission type (or kind) of organic light emitting element, the first electrode AE may be a reflective electrode, and the second electrode CE may be a transmissive electrode. When the display element DD is a double-sided emission type (or kind) of organic light emitting element, both of the first electrode AE and the second electrode CE may be transmissive electrodes. In this embodiment, a case where the display element DD is a top emission type (or kind) of organic light emitting element, and the first electrode AE is an anode electrode is described as an example.

In each pixel area, the first electrode AE may be disposed on the protective layer PSV. The first electrode AE may include a reflective layer capable of reflecting light and a transparent conductive layer disposed on the top or bottom of the reflective layer. At least one selected from the reflective layer and the transparent conductive layer may be connected to the drain electrode DE.

The reflective layer may include a material capable of reflecting light. For example, the reflective layer may include at least one selected from aluminum (Al), silver (Ag), chromium (Cr), molybdenum (Mo), platinum (Pt), nickel (Ni), and any alloy thereof.

The transparent conductive layer may include transparent conductive oxide. For example, the transparent conductive layer may include at least one transparent conductive oxide selected from indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

A pixel defining layer PDL may be disposed over the first electrode AE. The pixel defining layer PDL is disposed between the pixel areas, and may expose the first electrode AE therethrough. Also, the pixel defining layer PDL may overlap with an edge portion of the first electrode AE. Therefore, the pixel defining layer PDL may allow a majority of a surface of the first electrode AE, which faces the second substrate 120, to be exposed therethrough.

The pixel defining layer PDL may include an organic insulating material. For example, the pixel defining layer PDL may include at least one selected from polystyrene, polymethylmethacrylate (PMMA), polyacrylonitrile (PAN), polyimide (PA), polyimide (PI), polyarylether (PAE), heterocyclic polymer, parylene, epoxy, benzocyclobutene (BCB), siloxane based resin, and silane based resin.

The emitting layer EML may be disposed on the exposed surface of the first electrode AE. The emitting layer EML may have a multi-layered thin film structure including at least a light generation layer (LGL). For example, the emitting layer EML may include a hole injection layer (HIL) for injecting holes, a hole transport layer (HTL) having an excellent hole transporting property, the HTL for increasing the opportunity for holes and electrons to be re-combined by suppressing or reducing the movement of electrons that fail to be combined in the LGL, the LGL for emitting light through the re-combination of the injected electrons and holes, a hole blocking layer (HBL) for suppressing or reducing the movement of holes that fail to be combined in the LGL, an electron transport layer (ETL) smoothly transporting electrons to the LGL, and an electron transport layer (EIL) for injecting electrons.

The color of light generated in the LGL may be at least one selected from red, green, blue, and white, but this embodiment is not limited thereto. For example, the color of light generated in the LGL of the emitting layer EML may also be at least one selected from magenta, cyan, and yellow.

The HIL, the HTL, the HBL, the ETL, and the EIL may be common layers connected in adjacent light emitting regions.

The second electrode CE may be disposed on the emitting layer EML. The second electrode CE may be a semi-transmissive reflective layer. For example, the second electrode CE may be a thin metal layer having a thickness, through which light can be transmitted. The second electrode CE may allow a portion of the light emitted from the LGL to be transmitted therethrough, and reflect the rest of the light emitted from the LGL.

The second electrode CE may include a material having a lower work function than the transparent conductive layer. For example, the second electrode CE may include at least one selected from molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and any alloy thereof.

A portion of the light emitted from the emitting layer EML may not be transmitted through the second electrode CE, and the light reflected from the second electrode CE may be again reflected from the reflective layer. For example, the light emitted from the emitting layer EML may resonate between the reflective layer and the second electrode CE. The light extraction efficiency of the display element DD can be improved by the resonance of the light.

A distance between the reflective layer and the second electrode CE may be changed depending on a color of the light emitted from the LGL. For example, the distance between the reflective layer and the second electrode CE may be adjusted to correspond to a resonance distance, depending on the color of the light emitted from the LGL.

The encapsulating layer ECL may be provided over the second electrode CE. The encapsulating layer ECL may prevent oxygen and moisture from penetrating into the display element DD (or may reduce such penetration of oxygen and/or moisture). The encapsulating layer ECL may include a plurality of inorganic layers and a plurality of organic layers. For example, the encapsulating layer ECL may include a plurality of encapsulating units including the inorganic layer and the organic layer disposed on the inorganic layer. The inorganic layer may include at least one selected from silicon oxide, silicon nitride, silicon oxynitride, aluminum oxide, titanium oxide, zirconium oxide, and tin oxide. The organic layer may include at least one selected from acryl, polyimide (PI), polyamide (PA), and benzocyclobutene (BCB).

A connection pad unit CPDA including connection pads CPD may be provided in the non-display area NDA on the first base substrate SUB1.

The second substrate 120 may include a second base substrate SUB2, a touch sensor TS disposed on one surface of the second base substrate SUB2, e.g., an outer surface of the second base substrate SUB2, and a cover layer CVL covering the touch sensor TS.

The second base substrate SUB2 may include a transparent insulating material to enable light to be transmitted therethrough. Also, the second base substrate SUB2 may be a flexible substrate. For example, the second base substrate SUB2 may include at least one selected from polyethersulfone (PES), polyacrylate (PA), polyetherimide (PEI), polyethylene naphthalate (PEN), polyethylene terephthalate (PET), polyphenylene sulfide (PPS), polyarylate (PAR), polyimide (PI), polycarbonate (PC), cellulose triacetate (TAC), and cellulose acetate propionate (CAP). Also, the second base substrate SUB2 may include a fiber glass reinforced plastic (FRP).

The touch sensor TS may include a touch sensing electrode TSE disposed in a sensing area SA, a touch pad TPD disposed in a non-sensing area NSA, and a sensing line connecting the touch sensing electrode TSE and the touch pad TPD.

The touch pad TPD may be electrically connected to the connection pad CPD through the sensing line SL. Therefore, the touch pad TPD may apply a touch driving signal supplied from the outside of the touch sensor TS through the connection pad CPD and transmit a touch sensing signal sensed by the touch sensor TS to the outside.

The cover layer CVL may be disposed on the touch sensor TS. The cover layer CVL may include at least one selected from an organic insulating material and an inorganic insulating material. For example, the cover layer CVL may include at least one selected from silicon oxide and silicon nitride. The cover layer CVL may allow the touch pad TPD of the touch sensor TS to be exposed as a portion of the non-sensing area NSA is removed.

In an embodiment of the present disclosure, a portion of the non-sensing area NSA of the second substrate 120 may be bent. If the second substrate 120 is bent, the touch pad TPD may be disposed opposite to the connection pad CPD of the connection pad unit CPDA.

The adhesive layer ADL may be provided between the first substrate 110 and the second substrate 120. The adhesive layer ADL may include an adhesive material that enables light to be transmitted therethrough. For example, the adhesive layer ADL may include at least one selected from a photocurable adhesive, a thermosetting adhesive, and a pressure sensitive adhesive (PSA).

In addition, a conductive member may be provided between the connection pad CPD and the touch pad TPD. The conductive member may electrically connect the touch pad TPD and the connection pad CPD. The conductive member may include a conductive ball CMB or a conductive adhesive layer. Hereinafter, a case where the conductive member includes the conductive ball is described as an example. The conductive ball CMB may be provided in a form in which it is distributed in an anisotropic conductive film or anisotropic conductive resin.

A distance between the touch pad TPD and the connection pad CPD in a state in which the second substrate 120 is bent may be smaller than that between the touch pad TPD and the connection pad CPD in a state in which the second substrate 120 is not bent. For example, the distance between the touch pad TPD and the connection pad CPD may be decreased as the second substrate 120 is bent.

If the distance between the touch pad TPD and the connection pad CPD is decreased, a size of the conductive ball CMB may also be decreased. If the size of the conductive ball CMB is small, although a plurality of conductive balls CMB exist (or are present), a variation in size of the conductive balls CMB may be decreased. Thus, it is possible to prevent a contact failure between the touch pad TPD and the connection pad CPD due to the variation in size of the conductive balls CMB (or to reduce a likelihood or degree of such failure).

Further, if the size of the conductive ball CMB is decreased, it is possible to reduce a failure caused by distance non-uniformity between the first substrate 110 and the second substrate 120. For example, it is possible to uniformalize (or uniformize) a distance between the first substrate 110 and the second substrate 120 in an area in which the conductive ball CMB is disposed and a distance between the first substrate 110 and the second substrate 120 in an area in which the conductive ball CMB is not disposed.

Hereinafter, a fabricating method of the display device will be described with reference to FIGS. 8-14.

FIGS. 8-14 are process sectional views illustrating a fabricating method of the display device shown in FIGS. 1-7.

Figure 8:
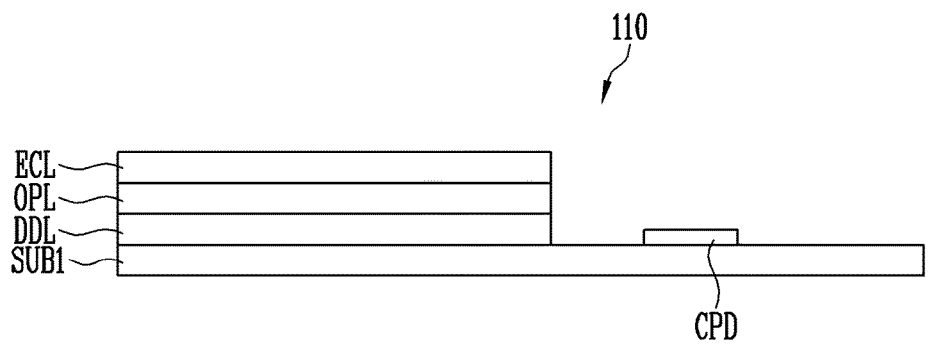
FIGS. 8-14 are process sectional views illustrating an embodiment of a fabricating method of the display device shown in FIGS. 1-7.

Referring to FIG. 8, a first substrate 110 is prepared. The first substrate 110 may include a first base substrate SUB1, a driving layer DDL provided on the first base substrate SUB1, an optical layer OPL provided on the driving layer DDL, and an encapsulating layer ECL provided on the optical layer OPL.

Hereinafter, a fabricating method of the first substrate 110 will be described in more detail.

The driving layer DDL is formed on the first base substrate SUB1.

The first base substrate SUB1 may include a display area (see "DA" of FIG. 2) and a non-display area (see "NDA" of FIG. 2).

The first base substrate SUB1 may include a transparent insulating material to enable light to be transmitted therethrough. Also, the first base substrate SUB1 may be a rigid substrate or flexible substrate.

The driving layer DDL may include at least one thin film transistor (see "TFT" of FIG. 7) and a protective layer (see "PSV" of FIG. 7) covering the thin film transistor TFT. The thin film transistor TFT may include a semiconductor layer (see "SCL" of FIG. 7), a gate electrode (see "GE" of FIG. 7), a source electrode (see "SE" of FIG. 7), and a drain electrode (see "DE" of FIG. 7).

The driving layer DDL may be fabricated as follows.

First, a buffer layer (see "BUL" of FIG. 7) is formed on the first base substrate SUB1. The buffer layer BUL may include an inorganic insulating material.

After the buffer layer BUL is formed, the semiconductor layer SCL is formed on the buffer layer BUL. In the semiconductor layer SCL, regions connected to the source electrode SE and the drain electrode DE may be a source region and a drain region into which impurities are doped or injected. A region between the source region and the drain region may be a channel region.

The semiconductor layer SCL may be formed by forming a semiconductor material on the buffer layer BUL and then patterning the semiconductor material. The semiconductor material may include at least one selected from amorphous Si, polycrystalline Si, oxide semiconductor, and organic semiconductor.

After the semiconductor layer SCL is formed, a gate insulating layer (see "GI" of FIG. 7) covering the semiconductor layer SCL may be formed. The gate insulating layer GI may cover the semiconductor layer SCL and the first base substrate SUB1. The gate insulating layer GI may insulate the semiconductor layer SCL and the gate electrode GE from each other. The gate insulating layer GI may include at least one selected from an organic insulating material and an inorganic insulating material.

After the gate insulating layer GI is formed, the gate electrode GE is formed on the gate insulating layer GI. At least a portion of the gate electrode GE may overlap with the semiconductor layer SCL. The gate electrode GE may be formed by depositing a low-resistance conductive material on the gate insulating layer GI and patterning the low-resistance conductive material. The low-resistance conductive material may be at least one selected from gold (Au), silver (Ag), aluminum (Al), molybdenum (Mo), chromium (Cr), titanium (Ti), nickel (Ni), neodymium (Nd), copper (Cu), tungsten (W), and any alloy thereof. In addition, the gate electrode GE may include a plurality of conductive layers that are sequentially stacked.

After the gate electrode GE is formed, an interlayer insulating layer (see "ILD" of FIG. 7) covering the gate electrode GE is formed. The interlayer insulating layer ILD may include at least one selected from an organic insulating material and an inorganic insulating material. For example, the interlayer insulating layer ILD may include at least one selected from silicon oxide and silicon nitride. The interlayer insulating layer ILD may insulate the source electrode SE and the drain electrode DE from the gate electrode GE.

After the interlayer insulating layer ILD is formed, the source region and the drain region of the semiconductor layer SCL are exposed by patterning the interlayer insulating layer ILD.

After the interlayer insulating layer ILD is patterned, the source electrode SE and the drain electrode DE are formed on the interlayer insulating layer ILD. The source electrode SE and the drain electrode DE may be formed by depositing and patterning a low-resistance conductive material. The low-resistance conductive material may be at least one selected from gold (Au), silver (Ag), aluminum (Al), molybdenum (Mo), chromium (Cr), titanium (Ti), nickel (Ni), neodymium (Nd), copper (Cu), tungsten (W), and any alloy thereof. In addition, the source electrode SE and the drain electrode DE may include a plurality of conductive layers that are sequentially stacked.

In this embodiment, a case where the thin film transistor TFT is a thin film transistor having a top gate structure has been described as an example, but the present disclosure is not limited thereto. For example, the thin film transistor TFT may be a thin film transistor having a bottom gate structure. If the thin film transistor TFT is a thin film transistor having a bottom gate structure, the gate electrode GE may be first formed before the semiconductor layer SCL is formed, and the source electrode SE and the drain electrode DE may be formed after the semiconductor layer SCL is formed.

After the thin film transistor TFT is formed, a protective layer PSV covering the thin film transistor TFT. The protective layer PSV may include at least one layer. For example, the protective layer PSV may include an inorganic protective layer and an organic protective layer disposed on the inorganic protective layer. The organic protective layer may include at least one selected from acryl, polyimide (PI), polyamide (PA), and benzocyclobutene (BCB). Also, the organic protective layer may be a planarization layer that is transparent and flexible to reduce and planarize winding of a lower structure.

Meanwhile, while the driving layer DDL is being formed, a connection pad unit CPDA including a connection pad CPD may be formed in the non-display area NDA on the first base substrate SUB1. The connection pad CPD may include the same or substantially the same material as the gate electrode GE, and be fabricated in the same process as the gate electrode GE. In some embodiments, the connection pad CPD may include the same material as the source electrode SE and the drain electrode DE, and be fabricated in the same or substantially the same process as described with respect to the source electrode SE and the drain electrode DE.

After the driving layer DDL is formed, the drain electrode DE of the thin film transistor TFT is exposed by patterning the protective layer PSV.

After the protective layer PSV is patterned, the optical layer OPL is formed on the protective layer PSV. The optical layer OPL may include a display element (see "DD" of FIG. 7) electrically connected to the drain electrode DE. The display element DD may include a first electrode (see "AE" of FIG. 7) connected to the drain electrode DE, an emitting layer (see "EML" of FIG. 7) disposed on the first electrode AE, and a second electrode (see "CE" of FIG. 7) disposed on the emitting layer EML.

The optical layer OPL may be formed as follows.

The first electrode AE is formed on the protective layer PSV. The first electrode AE may include a reflective layer capable of reflecting light and a transparent conductive layer disposed on the top or bottom of the reflective layer. At least one selected from the reflective layer and the transparent conductive layer may be connected to the drain electrode DE.

After the first electrode AE is formed, a pixel defining layer (see "PDL" of FIG. 7) exposing the first electrode AE therethrough is formed. The pixel defining layer PDL may be formed by coating an organic insulating material on the first electrode AE and the protective layer PSV and patterning the organic insulating material. The organic insulating material may include at least one selected from polystyrene, polymethylmethacrylate (PMMA), polyacrylonitrile (PAN), polyimide (PA), polyimide (PI), polyarylether (PAE), heterocyclic polymer, parylene, epoxy, benzocyclobutene (BCB), siloxane based resin, and silane based resin.

The pixel defining layer PDL is disposed between pixel areas PXA, and may expose the first electrode AE therethrough. Also, the pixel defining layer PDL may overlap with an edge portion of the first electrode AE. Therefore, the pixel defining layer PDL may allow a majority of a surface of the first electrode AE, which faces a second substrate 120, to be exposed therethrough.

After the pixel defining layer PDL is formed, the emitting layer EML is formed on the first electrode AE. The emitting layer EML may have a multi-layered thin film structure including at least a light generation layer (LGL). For example, the emitting layer EML may include a hole injection layer (HIL) for injecting holes, a hole transport layer (HTL) having an excellent hole transporting property, the HTL for increasing the opportunity for holes and electrons to be re-combined by suppressing or reducing the movement of electrons that fail to be combined in the LGL, the LGL for emitting light through the re-combination of the injected electrons and holes, a hole blocking layer (HBL) for suppressing or reducing the movement of holes that fail to be combined in the LGL, an electron transport layer (ETL) smoothly transporting electrons to the LGL, and an electron transport layer (EIL) for injecting electrons.

The color of light generated in the LGL may be at least one selected from red, green, blue, and white, but this embodiment is not limited thereto. For example, the color of light generated in the LGL of the emitting layer EML may also be at least one selected from magenta, cyan, and yellow.

The HIL, the HTL, the HBL, the ETL, and the EIL may be common layers connected in adjacent light emitting regions.

After the emitting layer EML is formed, the second electrode CE is formed on the emitting layer EML. The second electrode CE may be a thin metal layer having a thickness, through which light can be transmitted. The second electrode CE may allow a portion of the light emitted from the LGL to be transmitted therethrough, and reflect the rest of the light emitted from the LGL. The second electrode CE may include a material having a lower work function than the transparent conductive layer.

After the second electrode CE is formed, the encapsulating layer ECL is formed on the optical layer OPL. The encapsulating layer ECL may be provided over the second electrode CE. The encapsulating layer ECL may prevent oxygen and moisture from penetrating into the display element DD (or may reduce such penetration of oxygen and/or moisture). The encapsulating layer ECL may include a plurality of inorganic layers and a plurality of organic layers.

After the first substrate 110 is prepared, the second substrate 120 (see "120" of FIG. 6) is prepared. The second substrate 120 may include a second base substrate (see "SUB2" of FIG. 6), a touch sensor (see "TS" of FIG. 6) disposed on one surface of the second base substrate SUB2, e.g., a surface of the second base substrate SUB2, which faces the first substrate 110, and a cover layer (see "CVL" of FIG. 6) covering the touch sensor TS.

Hereinafter, a fabricating method of the second substrate 120 will be described with reference to FIGS. 9-12.

Figure 9:
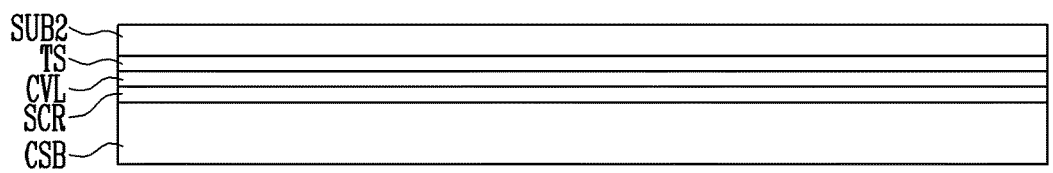

Referring to FIG. 9, a sacrificial layer SCR is formed on a carrier substrate CSB.

The carrier substrate CSB may be a supporting substrate for fabricating the second substrate 120. The carrier substrate CSB is a rigid substrate, and may be at least one selected from a glass substrate, a quartz substrate, a glass ceramic substrate, and a crystalline glass substrate.

The sacrificial layer SCR may be a layer for separating the second substrate 120 fabricated on the carrier substrate CSB. The sacrificial layer SCR may include a material having a selective etching ratio with respect to the second substrate 120 and an etchant. In some embodiments, the sacrificial layer SCR may include a material of which adhesion is decreased by laser or heat.

After the sacrificial layer SCR is formed, the second substrate 120 is formed on the sacrificial layer SCR.

The formation of the second substrate 120 on the sacrificial layer SCR will now be described in more detail. After the sacrificial layer SCR is formed, a cover layer CVL is formed on the sacrificial layer SCR. The cover layer CVL may include at least one selected from an organic insulating material and an inorganic insulating material. For example, the cover layer CVL may include at least one selected from silicon oxide and silicon nitride.

After the cover layer CVL is formed, the touch sensor TS is formed on the cover layer CVL. The touch sensor TS may include a touch sensing electrode (see "TSE" of FIG. 3) disposed in a sensing area (see "SA" of FIG. 3), a touch pad (see "TPD" of FIG. 3) disposed in a non-sensing area (see "NSA" of FIG. 3), and a sensing line connecting the touch sensing electrode TSE and the touch pad TPD.

After the touch sensor TS is formed, the second base substrate SUB2 is formed on the touch sensor TS. The second base substrate SUB may be a transparent flexible substrate. For example, the second base substrate SUB2 may include at least one selected from polyethersulfone (PES), polyacrylate (PA), polyetherimide (PEI), polyethylene naphthalate (PEN), polyethylene terephthalate (PET), polyphenylene sulfide (PPS), polyarylate (PAR), polyimide (PI), polycarbonate (PC), cellulose triacetate (TAC), and cellulose acetate propionate (CAP).

In this embodiment, a case where, after the sacrificial layer SCR is formed, the cover layer CVL, the touch sensor TS, and the second base substrate SUB2 are sequentially formed on the sacrificial layer SCR has been described as an example, but the present disclosure is not limited thereto. For example, after the sacrificial layer SCR is formed, the second base substrate SUB2, the touch sensor TS, and the cover layer CVL may be sequentially formed on the sacrificial layer SCR.

Figure 10:
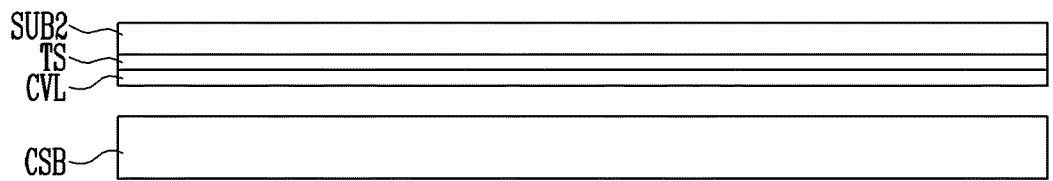

Referring to FIG. 10, after the second substrate 120 is formed on the sacrificial layer SCR, the carrier substrate CSB and the second substrate 120 are separated from each other. Here, a method of separating the carrier substrate CSB and the second substrate 120 from each other may be changed depending on characteristics of the sacrificial layer SCR.

For example, when the sacrificial layer SCR includes a material having a selective etching ratio with the second substrate 120 and an etchant, the sacrificial layer SCR may be removed using the etchant, so that the carrier substrate CBS and the second substrate 120 can be separated from each other.

In some embodiments, when the sacrificial layer SCR includes a material of which adhesion is decreased by laser or heat, the adhesion of the sacrificial layer SCR may be decreased by applying the laser or heat to the sacrificial layer SCR, and the carrier substrate CSB and the second substrate 120 may be physically separated from each other.

Figure 11:
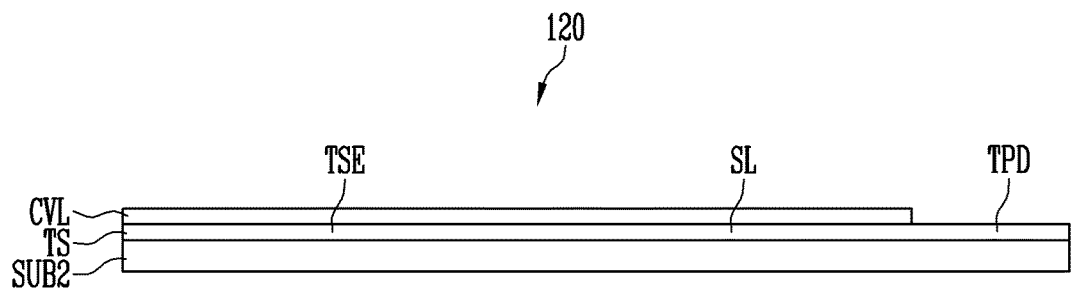

Referring to FIG. 11, after the carrier substrate CSB and the second substrate 120 are separated from each other, a portion of the cover layer CVL is removed by patterning the cover layer CVL. The touch pad TPD may be exposed by the patterning of the cover layer CVL.

Figure 12:
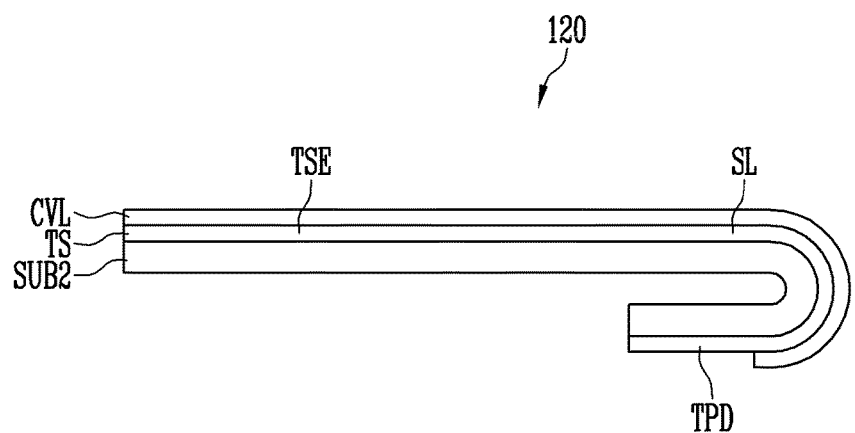

Referring to FIG. 12, after the touch pad TPD is exposed, the second substrate 120 is bent. An area in which the second substrate 120 is bent may be an area in which the touch pad TPD is disposed in the non-sensing area NSA.

Figure 13:
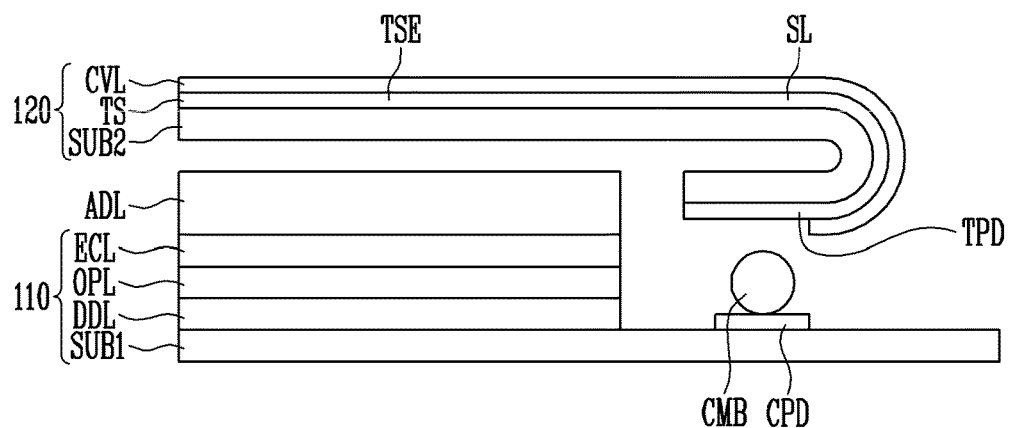

Referring to FIG. 13, after the second substrate 120 is bent, an adhesive layer ADL is formed on the first substrate 110. Here, the adhesive layer ADL may not be provided on the connection pad unit CPDA. The adhesive layer ADL may include an adhesive material that enables light to be transmitted therethrough. For example, the adhesive layer ADL may include at least one selected from a photocurable adhesive, a thermosetting adhesive, and a pressure sensitive adhesive (PSA).

Then, a conductive ball CMB is disposed on the connection pad CPD. The conductive ball CMB may be provided in a form in which it is distributed in an anisotropic conductive film or anisotropic conductive resin.

Meanwhile, in this embodiment, a case where, after the adhesive layer ADL is formed, the conductive ball CMB is disposed has been described as an example, but the present disclosure is not limited thereto. For example, the conductive ball CMB may be first disposed, and the adhesive layer ADL may be then formed.

After the conductive ball CMB is disposed on the connection pad CPD, the second substrate 120 may be disposed on the first substrate 110. Here, the connection pad CPD and the touch pad TPD may be opposite to each other.

Figure 14:
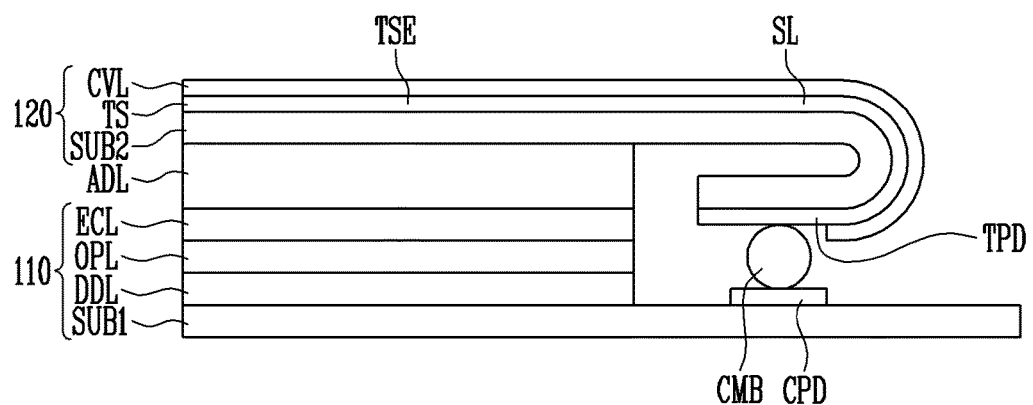

Referring to FIG. 14, after the second substrate 120 is disposed on the first substrate 110, the first substrate 110 and the second substrate 120 are joined together by applying heat or pressure to the first substrate 110 and the second substrate 120 or by irradiating light onto the first substrate 110 and the second substrate 120.

Here, the first substrate 110 and the second substrate 120 may be joined together by the adhesive layer ADL, and the connection pad CPD and the touch pad TPD may be electrically connected by the conductive ball CMB.

A distance between the touch pad TPD and the connection pad CPD in a state in which the second substrate 120 is bent may be smaller than that between the touch pad TPD and the connection pad CPD in a state in which the second substrate 120 is not bent. For example, the distance between the touch pad TPD and the connection pad CPD may be decreased as the second substrate 120 is bent.

If the distance between the touch pad TPD and the connection pad CPD is decreased, a size of the conductive ball CMB may also be decreased. If the size of the conductive ball CMB is small, although a plurality of conductive balls CMB exist (or are present), a variation in size of the conductive balls CMB may be decreased. Thus, it is possible to prevent a contact failure between the touch pad TPD and the connection pad CPD due to the variation in size of the conductive balls CMB (or to reduce a likelihood or degree of such a contact failure).

Further, if the size of the conductive ball CMB is decreased, it is possible to reduce a failure caused by distance non-uniformity between the first substrate 110 and the second substrate 120. For example, it is possible to uniformalize (or uniformize) a distance between the first substrate 110 and the second substrate 120 in an area in which the conductive ball CMB is disposed and a distance between the first substrate 110 and the second substrate 120 in an area in which the conductive ball CMB is not disposed.

Figure 15:
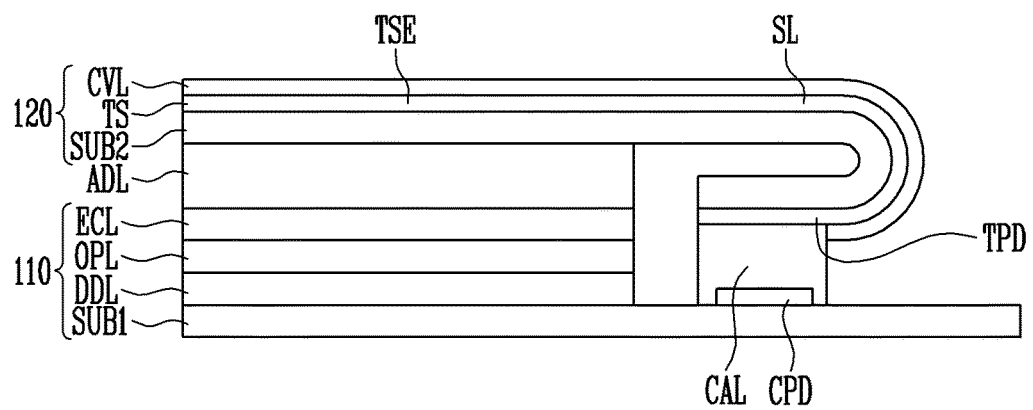
FIGS. 15-30 are sectional views illustrating display devices according to other embodiments of the present disclosure.

FIG. 15 is a sectional view illustrating a display device according to another embodiment of the present disclosure.

Referring to FIGS. 1-5 and 15, the display device may include a first substrate 110, a second substrate 120 opposite to the first substrate 110, and an adhesive layer ADL joining the first substrate 110 and the second substrate 120 together.

The first substrate 110 may include a first base substrate SUB1, a driving layer DDL provided on the first base substrate SUB1, an optical layer OPL provided on the driving layer DDL, and an encapsulating layer ECL provided on the optical layer OPL.

The first base substrate SUB1 may include a display area DA and a non-display area NDA. A plurality of pixel areas PXA may be provided in the display area DA. The non-display area NDA may be disposed adjacent to the display area DA.

The first base substrate SUB1 may include a transparent insulating material to enable light to be transmitted therethrough. Also, the first base substrate SUB1 may be a rigid substrate or flexible substrate.

The driving layer DDL is provided on the first base substrate SUB1, and may include at least one thin film transistor provided in each pixel area PXA and a protective layer covering the thin film transistor.

The optical layer OPL is provided on the driving layer DDL, and may include a display element connected to the thin film transistor.

The encapsulating layer ECL may be provided on the optical layer OPL. For example, the encapsulating layer ECL may cover the optical layer OPL. Also, the encapsulating layer ECL may prevent oxygen and moisture from penetrating into the display element DD (or may reduce such penetration of oxygen and/or moisture). The encapsulating layer ECL may include a plurality of inorganic layers and a plurality of organic layers.

A connection pad unit CPDA including a connection pad CPD may be provided in the non-display area NDA on the first base substrate SUB1.

The second substrate 120 may include a second base substrate SUB2, a touch sensor TS disposed on one surface of the second base substrate SUB2, e.g., an outer surface of the second base substrate SUB2, and a cover layer CVL covering the touch sensor TS.

The second base substrate SUB2 may be a transparent flexible substrate.

The touch sensor TS may include a touch sensing electrode TSE disposed in a sensing area SA, a touch pad TPD disposed in a non-sensing area NSA, and a sensing line SL connecting the touch sensing electrode TSE and the touch pad TPD.

The cover layer CVL may be disposed on the touch sensor TS. The cover layer CVL may allow the touch pad TPD of the touch sensor TS to be exposed as a portion of the non-sensing area NSA is removed.

In an embodiment of the present disclosure, a portion of the non-sensing area NSA of the second substrate 120 may be bent. If the second substrate 120 is bent, the touch pad TPD may be disposed opposite to the connection pad CPD of the connection pad unit CPDA. A conductive member may be provided between the connection pad CPD and the touch pad TPD. The conductive member may include a conductive ball or a conductive adhesive layer CAL. Hereinafter, a case where the conductive member includes the conductive adhesive layer CAL is described as an example. The conductive adhesive layer CAL may electrically connect the touch pad TPD and the connection pad CPD. The conductive adhesive layer CAL may include a conductive paste. For example, the conductive adhesive layer CAL may include at least one selected from an Ag paste, a Cu paste, a solder paste, and an ITO paste.

The adhesive layer ADL may be provided between the first substrate 110 and the second substrate 120. The adhesive layer ADL may join the first substrate 110 and the second substrate 120 together.

In an embodiment of the present disclosure, the conductive adhesive layer CAL is applied as a conductive member electrically connecting the connection pad CPD and the touch pad TPD. For example, the conductive ball is not used to electrically connect the connection pad CPD and the touch pad TPD, and thus it is possible to prevent a contact failure between the connection pad CPD and the touch pad TPD due to the variation in size of the conductive balls (or to reduce a likelihood or degree of such a contact failure).

Figure 16:
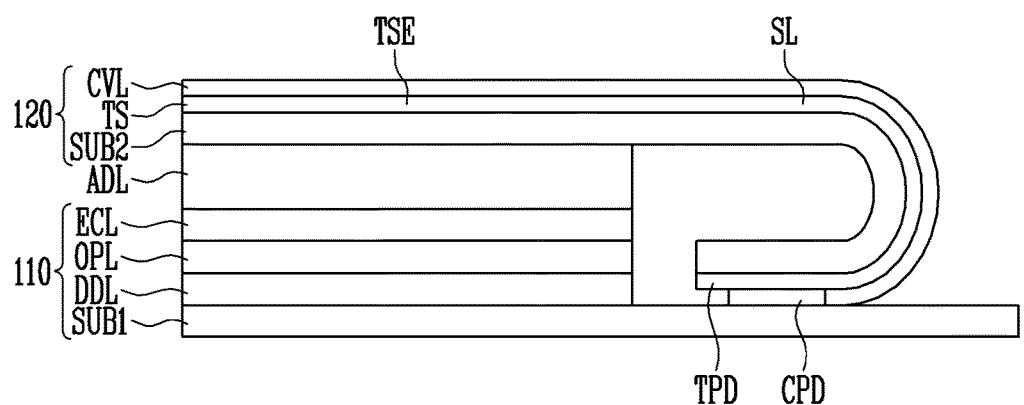

FIG. 16 is a sectional view illustrating a display device according to still another embodiment of the present disclosure.

Referring to FIGS. 1-5 and 16, the display device may include a first substrate 110, a second substrate 120 opposite to the first substrate 110, and an adhesive layer ADL joining the first substrate 110 and the second substrate 120 together.

The first substrate 110 may include a first base substrate SUB1 including a display area DA and a non-display area NDA, a driving layer DDL provided on the first base substrate SUB1, the driving layer DDL including at least one thin film transistor, an optical layer OPL provided on the driving layer DDL, the optical layer OPL including a display element connected to the thin film transistor, and an encapsulating layer ECL covering the optical layer OPL.

A connection pad unit CPDA including a connection pad CPD may be provided in the non-display area NDA on the first base substrate SUB1.

The second substrate 120 may include a second base substrate SUB2 including a sensing area SA and a non-sensing area NSA, a touch sensor TS disposed on one surface of the second base substrate SUB2, e.g., an outer surface of the second base substrate SUB2, and a cover layer CVL covering the touch sensor TS.

The touch sensor TS may include a touch sensing electrode TSE disposed in the sensing area SA, a touch pad TPD disposed in the non-sensing area NSA, and a sensing line SL connecting the touch sensing electrode TSE and the touch pad TPD.

The cover layer CVL may be disposed on the touch sensor TS. The cover layer CVL may allow the touch pad TPD of the touch sensor TS to be exposed as a portion of the non-sensing area NSA is removed.

In an embodiment of the present disclosure, a portion of the non-sensing area NSA of the second substrate 120 may be bent. If the second substrate 120 is bent, the touch pad TPD may be disposed opposite to the connection pad CPD of the connection pad unit CPDA. Also, the touch pad TPD may be in direct contact with the connection pad CPD.

The adhesive layer ADL may be provided between the first substrate 110 and the second substrate 120. The adhesive layer ADL may join the first substrate 110 and the second substrate 120 together.

In embodiments of the present disclosure, the connection pad CPD and the touch pad TPD are in direct contact with each other, the conductive ball is not required. Thus, it is possible to prevent a contact failure between the connection pad CPD and the touch pad TPD due to the variation in size of the conductive balls (or to reduce a likelihood or degree of such a contact failure).

Figure 17:
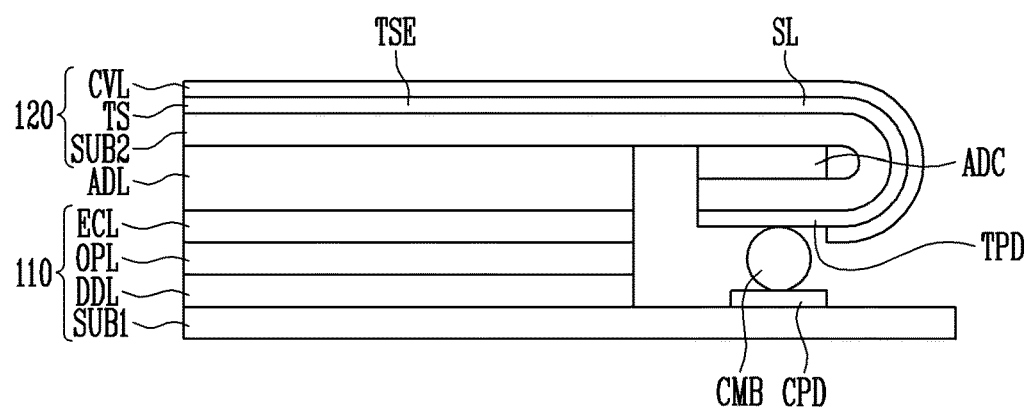

FIG. 17 is a sectional view illustrating a display device according to still another embodiment of the present disclosure.

Referring to FIGS. 1-5 and 17, the display device may include a first substrate 110, a second substrate 120 opposite to the first substrate 110, and an adhesive layer ADL joining the first substrate 110 and the second substrate 120 together.

The first substrate 110 may include a first base substrate SUB1 including a display area DA and a non-display area NDA, a driving layer DDL provided on the first base substrate SUB1, the driving layer DDL including at least one thin film transistor, an optical layer OPL provided on the driving layer DDL, the optical layer OPL including a display element connected to the thin film transistor, and an encapsulating layer ECL covering the optical layer OPL.

A connection pad unit CPDA including a connection pad CPD may be provided in the non-display area NDA on the first base substrate SUB1.

The second substrate 120 may include a second base substrate SUB2 including a sensing area SA and a non-sensing area NSA, a touch sensor TS disposed on one surface of the second base substrate SUB2, e.g., an outer surface of the second base substrate SUB2, and a cover layer CVL covering the touch sensor TS.

The touch sensor TS may include a touch sensing electrode TSE disposed in the sensing area SA, a touch pad TPD disposed in the non-sensing area NSA, and a sensing line SL connecting the touch sensing electrode TSE and the touch pad TPD.

The cover layer CVL may be disposed on the touch sensor TS. The cover layer CVL may allow the touch pad TPD of the touch sensor TS to be exposed as a portion of the non-sensing area NSA is removed.

In an embodiment of the present disclosure, a portion of the non-sensing area NSA of the second substrate 120 may be bent. If the second substrate 120 is bent, the touch pad TPD may be disposed opposite to the connection pad CPD of the connection pad unit CPDA.

In the non-sensing area NSA, an elastic member ADC may be disposed between areas of the second base substrate SUB2, which are disposed to face each other as the second substrate 120 is bent. The elastic member ADC may include an elastic film capable of restoring its original shape even when it is deformed by an external pressure or external impact, and an adhesive coated on both surfaces of the elastic film. Therefore, the elastic member ADC may serve as a supporter that allows the bent shape of the second substrate 120 to be maintained (e.g., at least substantially maintained).

A conductive ball CMB may be provided between the connection pad CPD and the touch pad TPD. The conductive ball CMB may electrically connect the touch pad TPD and the connection pad CPD. In this embodiment, a case where the connection pad CPD and the touch pad TPD are electrically connected using the conductive ball CMB has been described as an example, but the present disclosure is not limited thereto. For example, the connection pad CPD and the touch pad TPD may be electrically connected using a conductive adhesive layer.

Figure 18:
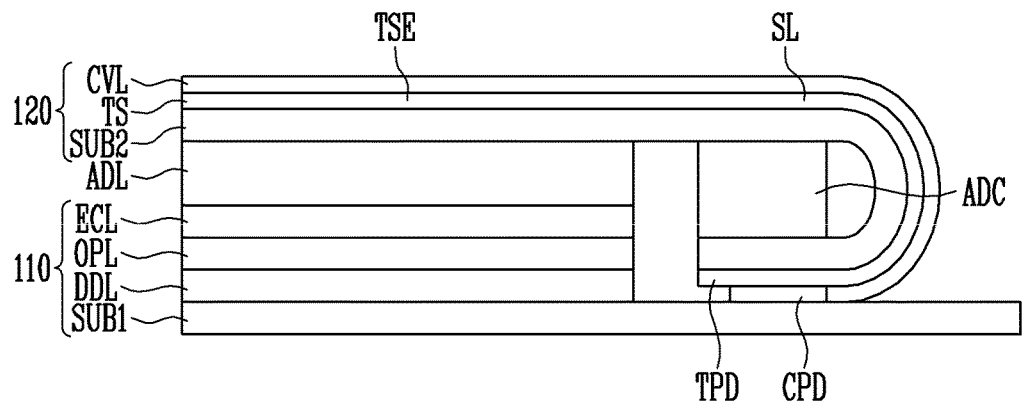

FIG. 18 is a sectional view illustrating a display device according to still another embodiment of the present disclosure.

Referring to FIGS. 1-5 and 18, the display device may include a first substrate 110, a second substrate 120 opposite to the first substrate 110, and an adhesive layer ADL joining the first substrate 110 and the second substrate 120 together.

The first substrate 110 may include a first base substrate SUB1 including a display area DA and a non-display area NDA, a driving layer DDL provided on the first base substrate SUB1, the driving layer DDL including at least one thin film transistor, an optical layer OPL provided on the driving layer DDL, the optical layer OPL including a display element connected to the thin film transistor, and an encapsulating layer ECL covering the optical layer OPL.

A connection pad unit CPDA including a connection pad CPD may be provided in the non-display area NDA on the first base substrate SUB1.

The second substrate 120 may include a second base substrate SUB2 including a sensing area SA and a non-sensing area NSA, a touch sensor TS disposed on one surface of the second base substrate SUB2, e.g., an outer surface of the second base substrate SUB2, and a cover layer CVL covering the touch sensor TS.

The touch sensor TS may include a touch sensing electrode TSE disposed in the sensing area SA, a touch pad TPD disposed in the non-sensing area NSA, and a sensing line SL connecting the touch sensing electrode TSE and the touch pad TPD.

The cover layer CVL may be disposed on the touch sensor TS. The cover layer CVL may allow the touch pad TPD of the touch sensor TS to be exposed as a portion of the non-sensing area NSA is removed.

In an embodiment of the present disclosure, a portion of the non-sensing area NSA of the second substrate 120 may be bent. If the second substrate 120 is bent, the touch pad TPD may be disposed opposite to the connection pad CPD of the connection pad unit CPDA. Also, the touch pad TPD may be in direct contact with the connection pad CPD.

In the non-sensing area NSA, an elastic member ADC having adhesion may be disposed between areas of the second base substrate SUB2, which are disposed to face each other as the second substrate 120 is bent. The bent shape of the second substrate 120 can be maintained (e.g., at least substantially maintained) by the elastic member ADC.

Figure 19:
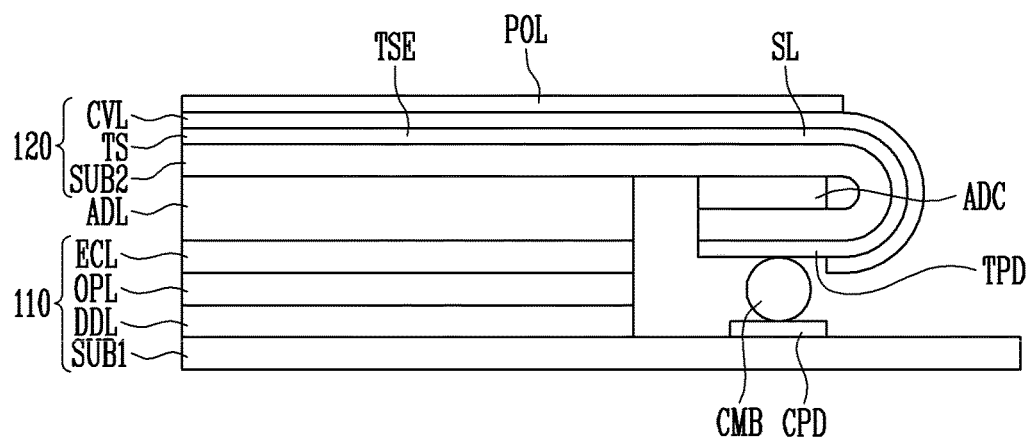

FIG. 19 is a sectional view illustrating a display device according to still another embodiment of the present disclosure.

Referring to FIGS. 1-5 and 19, the display device may include a first substrate 110, a second substrate 120 opposite to the first substrate 110, a polarizing layer POL disposed on one surface of the second substrate 120, and an adhesive layer ADL joining the first substrate 110 and the second substrate 120 together.

The first substrate 110 may include a first base substrate SUB1 including a display area DA and a non-display area NDA, a driving layer DDL provided on the first base substrate SUB1, the driving layer DDL including at least one thin film transistor, an optical layer OPL provided on the driving layer DDL, the optical layer OPL including a display element connected to the thin film transistor, and an encapsulating layer ECL covering the optical layer OPL.

A connection pad unit CPDA including a connection pad CPD may be provided in the non-display area NDA on the first base substrate SUB1.

The second substrate 120 may include a second base substrate SUB2 including a sensing area SA and a non-sensing area NSA, a touch sensor TS disposed on one surface of the second base substrate SUB2, e.g., an outer surface of the second base substrate SUB2, and a cover layer CVL covering the touch sensor TS.

The touch sensor TS may include a touch sensing electrode TSE disposed in the sensing area SA, a touch pad TPD disposed in the non-sensing area NSA, and a sensing line SL connecting the touch sensing electrode TSE and the touch pad TPD.

The cover layer CVL may be disposed on the touch sensor TS. The cover layer CVL may allow the touch pad TPD of the touch sensor TS to be exposed as a portion of the non-sensing area NSA is removed.

The polarizing layer POL may be provided on the cover layer CVL. The polarizing layer POL prevents external light incident into the display device from being reflected (or reduces an amount or degree of such reflection), thereby improving the display quality of the display device.

In an embodiment of the present disclosure, a portion of the non-sensing area NSA of the second substrate 120 may be bent. If the second substrate 120 is bent, the touch pad TPD may be disposed opposite to the connection pad CPD of the connection pad unit CPDA.

In the non-sensing area NSA, an elastic member ADC having adhesion may be disposed between areas of the second base substrate SUB2, which are disposed to face each other as the second substrate 120 is bent. The bent shape of the second substrate 120 can be maintained (e.g., at least substantially maintained) by the elastic member ADC.

A conductive ball CMB may be provided between the connection pad CPD and the touch pad TPD. The conductive ball CMB may electrically connect the touch pad TPD and the connection pad CPD. In this embodiment, a case where the connection pad CPD and the touch pad TPD are electrically connected using the conductive ball CMB has been described as an example, but the present disclosure is not limited thereto. For example, the connection pad CPD and the touch pad TPD may be electrically connected using a conductive adhesive layer.

Figure 20:
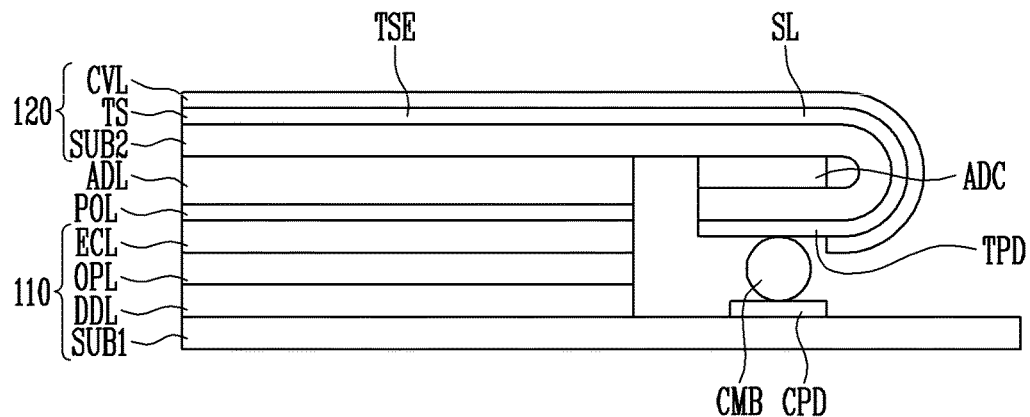

FIG. 20 is a sectional view illustrating a display device according to still another embodiment of the present disclosure.

Referring to FIGS. 1-5 and 20, the display device may include a first substrate 110, a second substrate 120 opposite to the first substrate 110, a polarizing layer POL disposed between the first substrate 110 and the second substrate 120, and an adhesive layer ADL joining the first substrate 110 and the second substrate 120 together.

The first substrate 110 may include a first base substrate SUB1 including a display area DA and a non-display area NDA, a driving layer DDL provided on the first base substrate SUB1, the driving layer DDL including at least one thin film transistor, an optical layer OPL provided on the driving layer DDL, the optical layer OPL including a display element connected to the thin film transistor, and an encapsulating layer ECL covering the optical layer OPL.

The polarizing layer POL may be disposed between the encapsulating layer ECL and the adhesive layer ADL. The polarizing layer POL prevents external light incident into the display device from being reflected (or reduces an amount or degree of such reflection), thereby improving the display quality of the display device.

A connection pad unit CPDA including a connection pad CPD may be provided in the non-display area NDA on the first base substrate SUB1.

The second substrate 120 may include a second base substrate SUB2 including a sensing area SA and a non-sensing area NSA, a touch sensor TS disposed on one surface of the second base substrate SUB2, e.g., an outer surface of the second base substrate SUB2, and a cover layer CVL covering the touch sensor TS.

The touch sensor TS may include a touch sensing electrode TSE disposed in the sensing area SA, a touch pad TPD disposed in the non-sensing area NSA, and a sensing line SL connecting the touch sensing electrode TSE and the touch pad TPD.

The cover layer CVL may be disposed on the touch sensor TS. The cover layer CVL may allow the touch pad TPD of the touch sensor TS to be exposed as a portion of the non-sensing area NSA is removed.

In an embodiment of the present disclosure, a portion of the non-sensing area NSA of the second substrate 120 may be bent. If the second substrate 120 is bent, the touch pad TPD may be disposed opposite to the connection pad CPD of the connection pad unit CPDA.

In the non-sensing area NSA, an elastic member ADC having adhesion may be disposed between areas of the second base substrate SUB2, which are disposed to face each other as the second substrate 120 is bent. The bent shape of the second substrate 120 can be maintained (e.g., at least substantially maintained) by the elastic member ADC.

A conductive ball CMB may be provided between the connection pad CPD and the touch pad TPD. The conductive ball CMB may electrically connect the touch pad TPD and the connection pad CPD. In this embodiment, a case where the connection pad CPD and the touch pad TPD are electrically connected using the conductive ball CMB has been described as an example, but the present disclosure is not limited thereto. For example, the connection pad CPD and the touch pad TPD may be electrically connected using a conductive adhesive layer.

Figure 21:
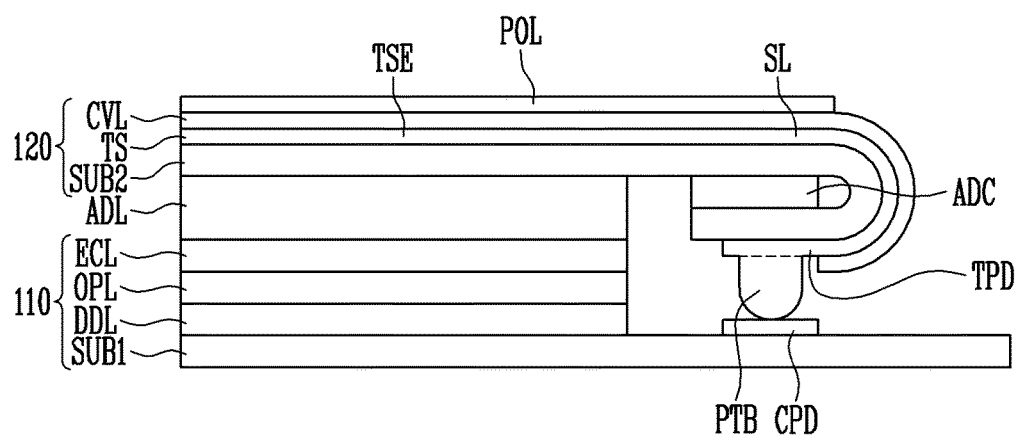

FIG. 21 is a sectional view illustrating a display device according to still another embodiment of the present disclosure.

Referring to FIGS. 1-5 and 21, the display device may include a first substrate 110, a second substrate 120 opposite to the first substrate 110, a polarizing layer POL disposed on one surface of the second substrate 120, and an adhesive layer ADL joining the first substrate 110 and the second substrate 120 together.

The first substrate 110 may include a first base substrate SUB1 including a display area DA and a non-display area NDA, a driving layer DDL provided on the first base substrate SUB1, the driving layer DDL including at least one thin film transistor, an optical layer OPL provided on the driving layer DDL, the optical layer OPL including a display element connected to the thin film transistor, and an encapsulating layer ECL covering the optical layer OPL.

A connection pad unit CPDA including a connection pad CPD may be provided in the non-display area NDA on the first base substrate SUB1.

The second substrate 120 may include a second base substrate SUB2 including a sensing area SA and a non-sensing area NSA, a touch sensor TS disposed on one surface of the second base substrate SUB2, e.g., an outer surface of the second base substrate SUB2, and a cover layer CVL covering the touch sensor TS.

The touch sensor TS may include a touch sensing electrode TSE disposed in the sensing area SA, a touch pad TPD disposed in the non-sensing area NSA, a sensing line SL connecting the touch sensing electrode TSE and the touch pad TPD, and a protruding bump PTB protruding from a portion of the touch pad TPD.

The cover layer CVL may be disposed on the touch sensor TS. The cover layer CVL may allow the touch pad TPD of the touch sensor TS to be exposed as a portion of the non-sensing area NSA is removed.

In an embodiment of the present disclosure, a portion of the non-sensing area NSA of the second substrate 120 may be bent. If the second substrate 120 is bent, the touch pad TPD and the protruding bump PTB may be disposed opposite to the connection pad CPD of the connection pad unit CPDA. In addition, the protruding bump PTB may be disposed to face the connection pad CPD. Also, the protruding bump PTB may be in direct contact with the connection pad CPD.

In the non-sensing area NSA, an elastic member ADC having adhesion may be disposed between areas of the second base substrate SUB2, which are disposed to face each other as the second substrate 120 is bent. The elastic member ADC may serve as a supporter that allows the bent shape of the second substrate 120 to be maintained (e.g., at least substantially maintained).

Figure 22:
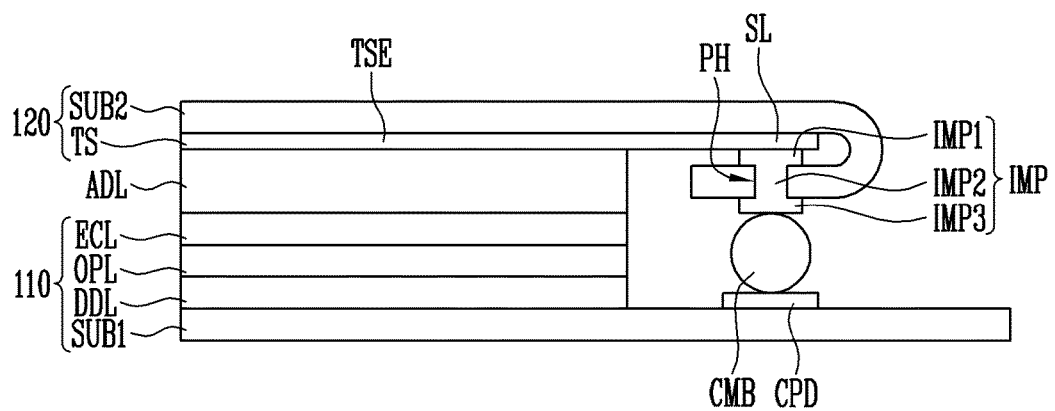

FIG. 22 is a sectional view illustrating a display device according to still another embodiment of the present disclosure.

Referring to FIGS. 1-5 and 22, the display device may include a first substrate 110, a second substrate 120 opposite to the first substrate 110, and an adhesive layer ADL joining the first substrate 110 and the second substrate 120 together.

The first substrate 110 may include a first base substrate SUB1 including a display area DA and a non-display area NDA, a driving layer DDL provided on the first base substrate SUB1, the driving layer DDL including at least one thin film transistor, an optical layer OPL provided on the driving layer DDL, the optical layer OPL including a display element connected to the thin film transistor, and an encapsulating layer ECL covering the optical layer OPL.

A connection pad unit CPDA including a connection pad CPD may be provided in the non-display area NDA on the first base substrate SUB1.

The second substrate 120 may include a second base substrate SUB2 including a sensing area SA and a non-sensing area NSA, and a touch sensor TS disposed on the second base substrate SUB2.

The touch sensor TS may include a touch sensing electrode TSE disposed in the sensing area SA, a metal pattern IMP disposed in the non-sensing area NSA, and a sensing line SL connecting the touch sensing electrode TSE and the metal pattern IMP.

The touch sensing electrode TSE and the sensing line SL may be disposed on one surface of the second base substrate SUB2, e.g., a surface of the second base substrate SUB2, which faces the first substrate 110.

The metal pattern IMP may include a first pattern IMP1, a second pattern IMP2, and a third pattern IMP3. The first pattern IMP1 and the third pattern IMP3 may be provided on different surfaces of the second base substrate SUB2, respectively.

The first pattern IMP1 may be provided on one surface of the second base substrate SUB2, e.g., a surface on which the touch sensing electrode TSE and the sensing line SL are disposed. The second pattern IMP2 may be provided in a through-hole PH passing through the second base substrate SUB2. Also, the second pattern IMP2 may connect the first pattern IMP1 and the third pattern IMP3. The third pattern IMP3 may be provided on the other surface of the second base substrate SUB2, e.g., a surface opposite to the surface on which the touch sensing electrode TSE and the sensing line SL are disposed.

The metal pattern IMP may be spaced apart from the sensing line SL before the second substrate 120 is bent.

In an embodiment of the present disclosure, a portion of the non-sensing area NSA of the second substrate 120 may be bent. If the second substrate 120 is bent, the metal pattern IMP may be electrically connected to the sensing line SL. Therefore, the metal pattern IMP may serve as a touch pad.

For example, the second substrate 120 is bent, the first pattern IMP1 may face the sensing line SL. Also, the first pattern IMP1 may be in direct contact with the sensing line SL. In addition, the third pattern IMP3 may be disposed opposite to the connection pad CPD of the connection pad unit CPDA.

A conductive ball CMB may be provided between the connection pad CPD and the third pattern IMP3. The conductive ball CMB may electrically connect the third pattern IMP3 and the connection pad CPD. In this embodiment, a case where the connection pad CPD and the third pattern IMP3 are electrically connected using the conductive ball CMB has been described as an example, but the present disclosure is not limited thereto. For example, the connection pad CPD and the third pattern IMP3 may be electrically connected using a conductive adhesive layer.

Figure 23:
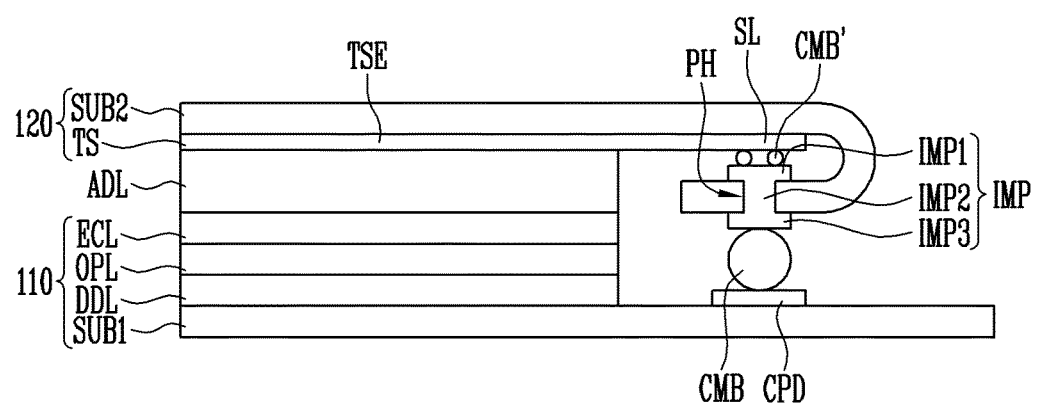

FIG. 23 is a sectional view illustrating a display device according to still another embodiment of the present disclosure.

Referring to FIGS. 1-5 and 23, the display device may include a first substrate 110, a second substrate 120 opposite to the first substrate 110, and an adhesive layer ADL joining the first substrate 110 and the second substrate 120 together.

The first substrate 110 may include a first base substrate SUB1 including a display area DA and a non-display area NDA, a driving layer DDL provided on the first base substrate SUB1, the driving layer DDL including at least one thin film transistor, an optical layer OPL provided on the driving layer DDL, the optical layer OPL including a display element connected to the thin film transistor, and an encapsulating layer ECL covering the optical layer OPL.

A connection pad unit CPDA including a connection pad CPD may be provided in the non-display area NDA on the first base substrate SUB1.

The second substrate 120 may include a second base substrate SUB2 including a sensing area SA and a non-sensing area NSA, and a touch sensor TS disposed on the second base substrate SUB2.

The touch sensor TS may include a touch sensing electrode TSE disposed in the sensing area SA, a metal pattern IMP disposed in the non-sensing area NSA, and a sensing line SL connecting the touch sensing electrode TSE and the metal pattern IMP.

The touch sensing electrode TSE and the sensing line SL may be disposed on one surface of the second base substrate SUB2, e.g., a surface of the second base substrate SUB2, which faces the first substrate 110.

The metal pattern IMP may include a first pattern IMP1, a second pattern IMP2, and a third pattern IMP3. The first pattern IMP1 may be provided on a surface of the second base substrate SUB2, on which the touch sensing electrode TSE and the sensing line SL are disposed. The second pattern IMP2 may be provided in a through-hole PH passing through the second base substrate SUB2. Also, the second pattern IMP2 may connect the first pattern IMP1 and the third pattern IMP3. The third pattern IMP3 may be provided on a surface opposite to the surface of the second base substrate SUB2, on which the first pattern IMP1 is disposed.

In an embodiment of the present disclosure, a portion of the non-sensing area NSA of the second substrate 120 may be bent. If the second substrate 120 is bent, the first pattern IMP1 may face the sensing line SL, and the third pattern IMP3 may be disposed opposite to the connection pad CPD of the connection pad unit CPDA.

A first conductive ball CMB may be provided between the connection pad CPD and the third pattern IMP3. The first conductive ball CMB may electrically connect the third pattern IMP3 and the connection pad CPD. In this embodiment, a case where the connection pad CPD and the third pattern IMP3 are electrically connected using the first conductive ball CMB has been described as an example, but the present disclosure is not limited thereto. For example, the connection pad CPD and the third pattern IMP3 may be electrically connected using a conductive adhesive layer.

At least one second conductive ball CMB' may be provided between the first pattern IMP1 and the sensing line SL. The second conductive ball CMB' may electrically connect the first pattern IMP1 and the sensing line SL. Here, a size of the second conductive ball CMB' may be equal to or less than that of the first conductive ball CMB. In this embodiment, a case where the first pattern IMP1 and the sensing line SL are electrically connected using the second conductive ball CMB' has been described as an example, but the present disclosure is not limited thereto. For example, the connection pad CPD and the first pattern IMP1 may be electrically connected using a conductive adhesive layer.

Figure 24:
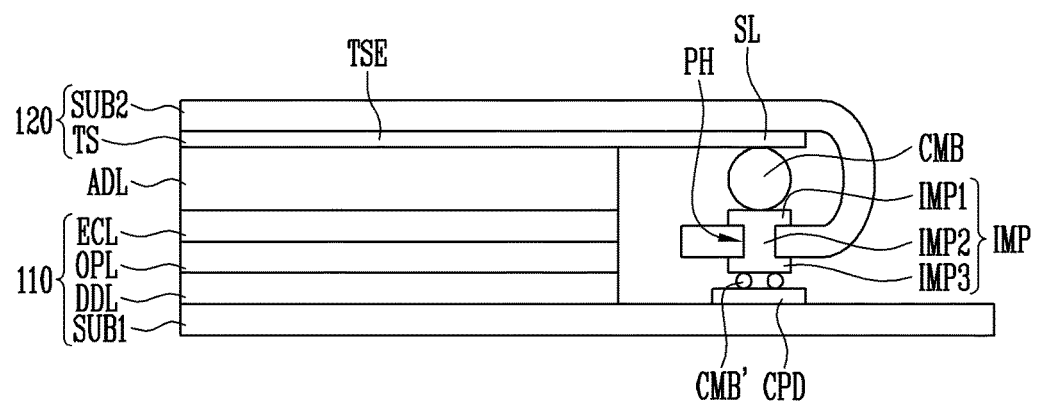

FIG. 24 is a sectional view illustrating a display device according to still another embodiment of the present disclosure.

Referring to FIGS. 1-5 and 24, the display device may include a first substrate 110, a second substrate 120 opposite to the first substrate 110, and an adhesive layer ADL joining the first substrate 110 and the second substrate 120 together.

The first substrate 110 may include a first base substrate SUB1 including a display area DA and a non-display area NDA, a driving layer DDL provided on the first base substrate SUB1, the driving layer DDL including at least one thin film transistor, an optical layer OPL provided on the driving layer DDL, the optical layer OPL including a display element connected to the thin film transistor, and an encapsulating layer ECL covering the optical layer OPL.

A connection pad unit CPDA including a connection pad CPD may be provided in the non-display area NDA on the first base substrate SUB1.

The second substrate 120 may include a second base substrate SUB2 including a sensing area SA and a non-sensing area NSA, and a touch sensor TS disposed on the second base substrate SUB2.

The touch sensor TS may include a touch sensing electrode TSE disposed in the sensing area SA, a metal pattern IMP disposed in the non-sensing area NSA, and a sensing line SL connecting the touch sensing electrode TSE and the metal pattern IMP.

The touch sensing electrode TSE and the sensing line SL may be disposed on a surface of the second base substrate SUB2, which faces the first substrate 110.

The metal pattern IMP may include a first pattern IMP1, a second pattern IMP2, and a third pattern IMP3. The first pattern IMP1 may be provided on a surface of the second base substrate SUB2, on which the touch sensing electrode TSE and the sensing line SL are disposed. The second pattern IMP2 may be provided in a through-hole PH passing through the second base substrate SUB2. Also, the second pattern IMP2 may connect the first pattern IMP1 and the third pattern IMP3. The third pattern IMP3 may be provided on a surface opposite to the surface of the second base substrate SUB2, on which the first pattern IMP1 is disposed.

In an embodiment of the present disclosure, a portion of the non-sensing area NSA of the second substrate 120 may be bent. If the second substrate 120 is bent, the first pattern IMP1 may face the sensing line SL, and the third pattern IMP3 may be disposed opposite to the connection pad CPD of the connection pad unit CPDA.

A first conductive ball CMB may be provided between the first pattern IMP1 and the sensing line SL. The first conductive ball CMB may electrically connect the first pattern IMP1 and the sensing line SL. In this embodiment, a case where the first pattern IMP1 and the sensing line SL are electrically connected using the first conductive ball CMB has been described as an example, but the present disclosure is not limited thereto. For example, the first pattern IMP1 and the sensing line SL may be electrically connected using a conductive adhesive layer.

At least one second conductive ball CMB' may be provided between the connection pad CPD and the third pattern IMP3. The second conductive ball CMB' may electrically connect the third pattern IMP3 and the connection pad CPD. Here, a size of the second conductive ball CMB' may be equal to or less than that of the first conductive ball CMB. In this embodiment, a case where the connection pad CPD and the third pattern IMP3 are electrically connected using the second conductive ball CMB' has been described as an example, but the present disclosure is not limited thereto. For example, the connection pad CPD and the third pattern IMP3 may be electrically connected using a conductive adhesive layer.

Figure 25:
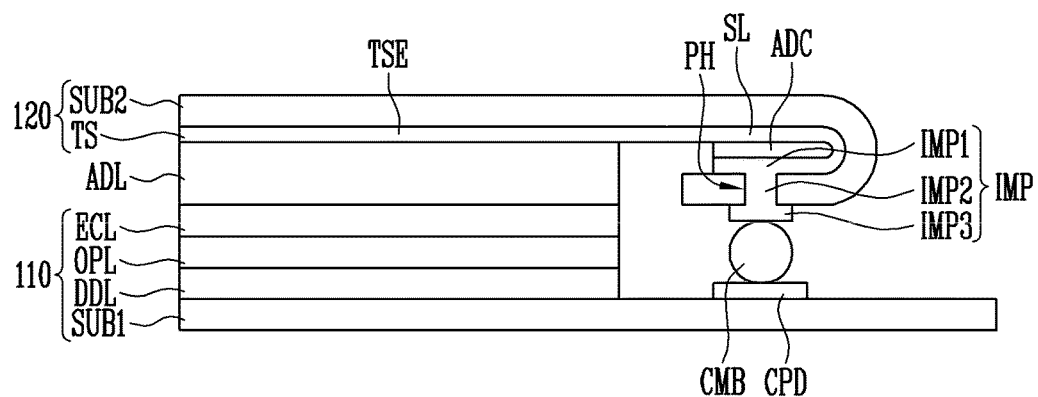

FIG. 25 is a sectional view illustrating a display device according to still another embodiment of the present disclosure.

Referring to FIGS. 1-5 and 25, the display device may include a first substrate 110, a second substrate 120 opposite to the first substrate 110, and an adhesive layer ADL joining the first substrate 110 and the second substrate 120 together.

The first substrate 110 may include a first base substrate SUB1 including a display area DA and a non-display area NDA, a driving layer DDL provided on the first base substrate SUB1, the driving layer DDL including at least one thin film transistor, an optical layer OPL provided on the driving layer DDL, the optical layer OPL including a display element connected to the thin film transistor, and an encapsulating layer ECL covering the optical layer OPL.

A connection pad unit CPDA including a connection pad CPD may be provided in the non-display area NDA on the first base substrate SUB1.

The second substrate 120 may include a second base substrate SUB2 including a sensing area SA and a non-sensing area NSA, and a touch sensor TS disposed on the second base substrate SUB2.

The touch sensor TS may include a touch sensing electrode TSE disposed in the sensing area SA, a metal pattern IMP disposed in the non-sensing area NSA, and a sensing line SL connecting the touch sensing electrode TSE and the metal pattern IMP.

The touch sensing electrode TSE and the sensing line SL may be disposed on a surface of the second base substrate SUB2, which faces the first substrate 110.

The metal pattern IMP may include a first pattern IMP1, a second pattern IMP2, and a third pattern IMP3. The first pattern IMP1 may be provided on a surface of the second base substrate SUB2, on which the touch sensing electrode TSE and the sensing line SL are disposed. Also, the first pattern IMP1 may have a shape in which the sensing line SL extends. The second pattern IMP2 may be provided in a through-hole PH passing through the second base substrate SUB2. Also, the second pattern IMP2 may connect the first pattern IMP1 and the third pattern IMP3. The third pattern IMP3 may be provided on a surface opposite to the surface of the second base substrate SUB2, on which the first pattern IMP1 is disposed.

In an embodiment of the present disclosure, a portion of the non-sensing area NSA of the second substrate 120 may be bent. If the second substrate 120 is bent, the third pattern IMP3 may be disposed opposite to the connection pad CPD of the connection pad unit CPDA.

A conductive ball CMB may be provided between the connection pad CPD and the third pattern IMP3. The first conductive ball CMB may electrically connect the third pattern IMP3 and the connection pad CPD. In this embodiment, a case where the connection pad CPD and the third pattern IMP3 are electrically connected using the conductive ball CMB has been described as an example, but the present disclosure is not limited thereto. For example, the connection pad CPD and the third pattern IMP3 may be electrically connected using a conductive adhesive layer.

In the non-sensing area NSA, an elastic member ADC having adhesion may be disposed between the sensing line SL and the first pattern IMP1, which face each other as the second substrate 120 is bent. The elastic member ADC may serve as a supporter that allows the bent shape of the second substrate 120 to be maintained (e.g., at least substantially maintained).

Figure 26:
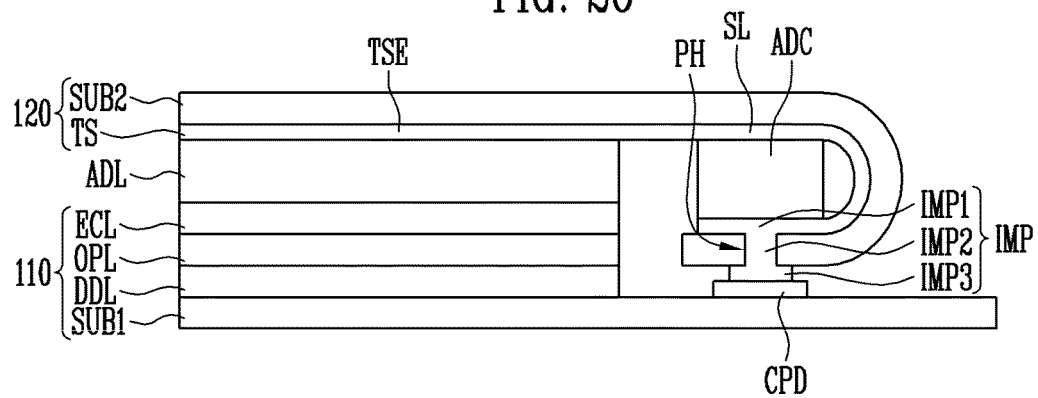

FIG. 26 is a sectional view illustrating a display device according to still another embodiment of the present disclosure.

Referring to FIGS. 1-5 and 26, the display device may include a first substrate 110, a second substrate 120 opposite to the first substrate 110, and an adhesive layer ADL joining the first substrate 110 and the second substrate 120 together.

The first substrate 110 may include a first base substrate SUB1 including a display area DA and a non-display area NDA, a driving layer DDL provided on the first base substrate SUB1, the driving layer DDL including at least one thin film transistor, an optical layer OPL provided on the driving layer DDL, the optical layer OPL including a display element connected to the thin film transistor, and an encapsulating layer ECL covering the optical layer OPL.

A connection pad unit CPDA including a connection pad CPD may be provided in the non-display area NDA on the first base substrate SUB1.

The second substrate 120 may include a second base substrate SUB2 including a sensing area SA and a non-sensing area NSA, and a touch sensor TS disposed on the second base substrate SUB2.

The touch sensor TS may include a touch sensing electrode TSE disposed in the sensing area SA, a metal pattern IMP disposed in the non-sensing area NSA, and a sensing line SL connecting the touch sensing electrode TSE and the metal pattern IMP.

The touch sensing electrode TSE and the sensing line SL may be disposed on a surface of the second base substrate SUB2, which faces the first substrate 110.

The metal pattern IMP may include a first pattern IMP1, a second pattern IMP2, and a third pattern IMP3. The first pattern IMP1 may be provided on a surface of the second base substrate SUB2, on which the touch sensing electrode TSE and the sensing line SL are disposed. Also, the first pattern IMP1 may have a shape in which the sensing line SL extends. The second pattern IMP2 may be provided in a through-hole PH passing through the second base substrate SUB2. Also, the second pattern IMP2 may connect the first pattern IMP1 and the third pattern IMP3. The third pattern IMP3 may be provided on a surface opposite to the surface of the second base substrate SUB2, on which the first pattern IMP1 is disposed.

In an embodiment of the present disclosure, a portion of the non-sensing area NSA of the second substrate 120 may be bent. If the second substrate 120 is bent, the third pattern IMP3 may be disposed opposite to the connection pad CPD of the connection pad unit CPDA. The third pattern IMP3 may be in direct contact with the connection pad CPD.

In the non-sensing area NSA, an elastic member ADC having adhesion may be disposed between the sensing line SL and the first pattern IMP1, which face each other as the second substrate 120 is bent. The bent shape of the second substrate 120 can be maintained (e.g., at least substantially maintained) by the elastic member ADC.

Figure 27:
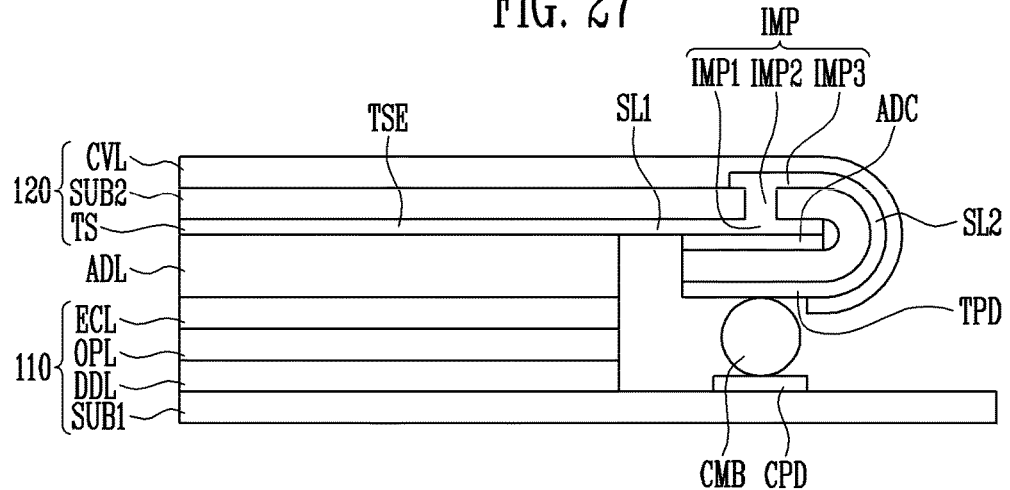

FIG. 27 is a sectional view illustrating a display device according to still another embodiment of the present disclosure.

Referring to FIGS. 1-5 and 27, the display device may include a first substrate 110, a second substrate 120 opposite to the first substrate 110, and an adhesive layer ADL joining the first substrate 110 and the second substrate 120 together.

The first substrate 110 may include a first base substrate SUB1 including a display area DA and a non-display area NDA, a driving layer DDL provided on the first base substrate SUB1, the driving layer DDL including at least one thin film transistor, an optical layer OPL provided on the driving layer DDL, the optical layer OPL including a display element connected to the thin film transistor, and an encapsulating layer ECL covering the optical layer OPL.

A connection pad unit CPDA including a connection pad CPD may be provided in the non-display area NDA on the first base substrate SUB1.

The second substrate 120 may include a second base substrate SUB2 including a sensing area SA and a non-sensing area NSA, and a touch sensor TS disposed on the second base substrate SUB2.

The touch sensor TS may include a touch sensing electrode TSE disposed in the sensing area SA, a metal pattern IMP disposed in the non-sensing area NSA, a first sensing line SL1 connecting the touch sensing electrode TSE and the metal pattern IMP, a touch pad disposed to be spaced apart from the metal pattern IMP, and a second sensing line SL2 connecting the metal pattern IMP and the touch pad TPD.

The touch sensing electrode TSE and the first sensing line SL1 may be disposed on a surface of the second base substrate SUB, which faces the first substrate 110.

The metal pattern IMP may include a first pattern IMP1, a second pattern IMP2, and a third pattern IMP3. The first pattern IMP1 may be provided on a surface of the second base substrate SUB2, on which the touch sensing electrode TSE and the sensing line SL are disposed. Also, the first pattern IMP1 may have a shape in which the sensing line SL extends. The second pattern IMP2 may be provided in a through-hole PH passing through the second base substrate SUB2. Also, the second pattern IMP2 may connect the first pattern IMP1 and the third pattern IMP3. The third pattern IMP3 may be provided on a surface opposite to the surface of the second base substrate SUB2, on which the first pattern IMP1 is disposed.

The second sensing line SL2 may be provided on a surface of the second base substrate SUB2, on which the third pattern IMP3 is disposed. Also, the second sensing line SL2 may have a shape in which the third pattern IMP3 extends.

The touch pad TPD may be provided on a surface of the base substrate SUB2, on which the second sensing line SL2 is disposed. Also, the touch pad TPD may have a shape in which the second sensing line SL2 extends. For example, the third pattern IMP3, the second sensing line SL2, and the touch pad TPD may be provided on an outer surface of the second base substrate SUB2. Also, the third pattern IMP3, the second sensing line SL2, and the touch pad TPD may be integrally formed.

A cover layer CVL may be provided on the surface of the second base substrate SUB2, on which the third pattern IMP3, the second sensing line SL2, and the touch pad TPD are provided. The cover layer CVL may cover the third pattern IMP3 and the second sensing line SL2. Also, the cover layer CVL may expose the touch pad TPD therethrough.

In an embodiment of the present disclosure, a portion of the non-sensing area NSA of the second substrate 120 may be bent. If the second substrate 120 is bent, the touch pad TPD may be disposed opposite to the connection pad CPD of the connection pad unit CPDA.

A conductive ball CMB may be provided between the connection pad CPD and the touch pad TPD. The first conductive ball CMB may electrically connect the touch pad TPD and the connection pad CPD. In this embodiment, a case where the connection pad CPD and the touch pad TPD are electrically connected using the conductive ball CMB has been described as an example, but the present disclosure is not limited thereto. For example, the connection pad CPD and the touch pad TPD may be electrically connected using a conductive adhesive layer.

In the non-sensing area NSA, an elastic member ADC having adhesion may be disposed between the first pattern IMP1 and the second base substrate SUB2, which face each other as the second substrate 120 is bent. The bent shape of the second substrate 120 can be maintained (e.g., at least substantially maintained) by the elastic member ADC.

Figure 28:
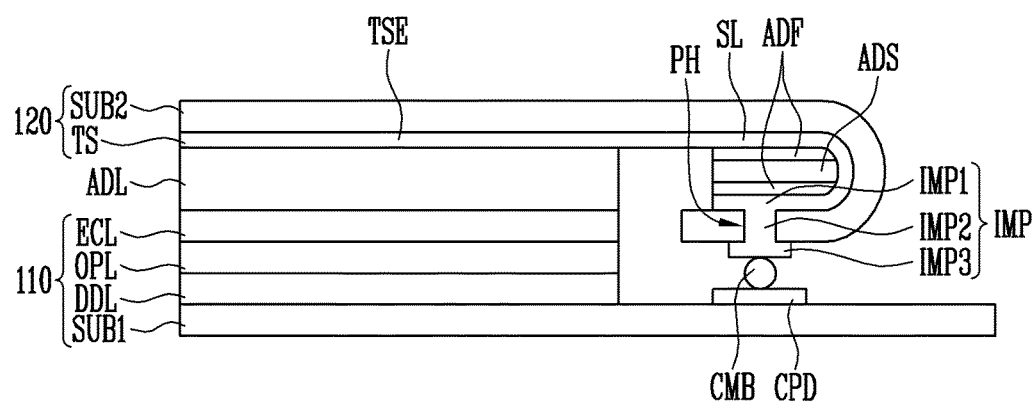

FIG. 28 is a sectional view illustrating a display device according to still another embodiment of the present disclosure.

Referring to FIGS. 1-5 and 28, the display device may include a first substrate 110, a second substrate 120 opposite to the first substrate 110, and an adhesive layer ADL joining the first substrate 110 and the second substrate 120 together.

The first substrate 110 may include a first base substrate SUB1 including a display area DA and a non-display area NDA, a driving layer DDL provided on the first base substrate SUB1, the driving layer DDL including at least one thin film transistor, an optical layer OPL provided on the driving layer DDL, the optical layer OPL including a display element connected to the thin film transistor, and an encapsulating layer ECL covering the optical layer OPL.

A connection pad unit CPDA including a connection pad CPD may be provided in the non-display area NDA on the first base substrate SUB1.

The second substrate 120 may include a second base substrate SUB2 including a sensing area SA and a non-sensing area NSA, and a touch sensor TS disposed on the second base substrate SUB2.

The touch sensor TS may include a touch sensing electrode TSE disposed in the sensing area SA, a metal pattern IMP disposed in the non-sensing area NSA, and a sensing line SL connecting the touch sensing electrode TSE and the metal pattern IMP.

The touch sensing electrode TSE and the sensing line SL may be disposed on a surface of the second base substrate SUB2, which faces the first substrate 110.

The metal pattern IMP may include a first pattern IMP1, a second pattern IMP2, and a third pattern IMP3. The first pattern IMP1 may be provided on a surface of the second base substrate SUB2, on which the touch sensing electrode TSE and the sensing line SL are disposed. Also, the first pattern IMP1 may have a shape in which the sensing line SL extends. The second pattern IMP2 may be provided in a through-hole PH passing through the second base substrate SUB2. Also, the second pattern IMP2 may connect the first pattern IMP1 and the third pattern IMP3. The third pattern IMP3 may be provided on a surface opposite to the surface of the second base substrate SUB2, on which the first pattern IMP1 is disposed.

In an embodiment of the present disclosure, a portion of the non-sensing area NSA of the second substrate 120 may be bent. If the second substrate 120 is bent, the third pattern IMP3 may be disposed opposite to the connection pad CPD of the connection pad unit CPDA.

A conductive ball CMB may be provided between the connection pad CPD and the third pattern IMP3. The first conductive ball CMB may electrically connect the third pattern IMP3 and the connection pad CPD. In this embodiment, a case where the connection pad CPD and the third pattern IMP3 are electrically connected using the conductive ball CMB has been described as an example, but the present disclosure is not limited thereto. For example, the connection pad CPD and the third pattern IMP3 may be electrically connected using a conductive adhesive layer.

In the non-sensing area NSA, a supporting member ADS and a supporting member adhesive layer ADF disposed on both surfaces of the supporting member ADS may be provided between the sensing line SL and the first pattern IMP1, which face each other as the second substrate 120 is bent. The supporting member adhesive layer ADF may be at least one selected from an adhesive film and an adhesive resin. Also, the supporting member adhesive layer ADF may allow the supporting member ADS to be fixed between the sensing line SL and the first pattern IMP1. Thus, the bent shape of the second substrate 120 can be maintained (e.g., at least substantially maintained) by the supporting member ADS and the supporting member adhesive layer ADF.

Figure 29:
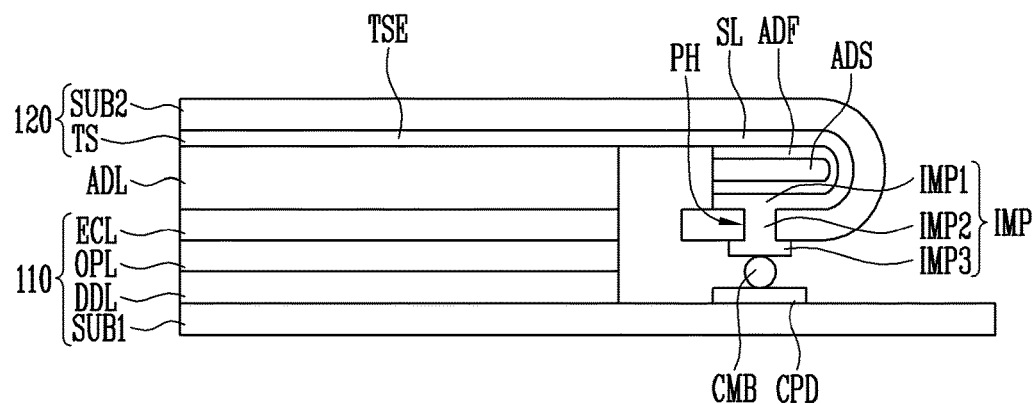

FIG. 29 is a sectional view illustrating a display device according to still another embodiment of the present disclosure. In FIG. 29, for convenience of illustration, a case where a conductive member includes a conductive ball is described as an example.

Referring to FIGS. 1-5 and 29, the display device may include a first substrate 110, a second substrate 120 opposite to the first substrate 110, and an adhesive layer ADL joining the first substrate 110 and the second substrate 120 together.

The first substrate 110 may include a first base substrate SUB1 including a display area DA and a non-display area NDA, a driving layer DDL provided on the first base substrate SUB1, the driving layer DDL including at least one thin film transistor, an optical layer OPL provided on the driving layer DDL, the optical layer OPL including a display element connected to the thin film transistor, and an encapsulating layer ECL covering the optical layer OPL.

A connection pad unit CPDA including a connection pad CPD may be provided in the non-display area NDA on the first base substrate SUB1.

The second substrate 120 may include a second base substrate SUB2 including a sensing area SA and a non-sensing area NSA, and a touch sensor TS disposed on the second base substrate SUB2.

The touch sensor TS may include a touch sensing electrode TSE disposed in the sensing area SA, a metal pattern IMP disposed in the non-sensing area NSA, and a sensing line SL connecting the touch sensing electrode TSE and the metal pattern IMP.

The touch sensing electrode TSE and the sensing line SL may be disposed on a surface of the second base substrate SUB2, which faces the first substrate 110.

The metal pattern IMP may include a first pattern IMP1, a second pattern IMP2, and a third pattern IMP3. The first pattern IMP1 may be provided on a surface of the second base substrate SUB2, on which the touch sensing electrode TSE and the sensing line SL are disposed. Also, the first pattern IMP1 may have a shape in which the sensing line SL extends. The second pattern IMP2 may be provided in a through-hole PH passing through the second base substrate SUB2. Also, the second pattern IMP2 may connect the first pattern IMP1 and the third pattern IMP3. The third pattern IMP3 may be provided on a surface opposite to the surface of the second base substrate SUB2, on which the first pattern IMP1 is disposed.

In an embodiment of the present disclosure, a portion of the non-sensing area NSA of the second substrate 120 may be bent. If the second substrate 120 is bent, the third pattern IMP3 may be disposed opposite to the connection pad CPD of the connection pad unit CPDA.

A conductive ball CMB may be provided between the connection pad CPD and the third pattern IMP3. The first conductive ball CMB may electrically connect the third pattern IMP3 and the connection pad CPD. In this embodiment, a case where the connection pad CPD and the third pattern IMP3 are electrically connected using the conductive ball CMB has been described as an example, but the present disclosure is not limited thereto. For example, the connection pad CPD and the third pattern IMP3 may be electrically connected using a conductive adhesive layer.

In the non-sensing area NSA, there may be provided a supporting member ADS disposed between the sensing line SL and the first pattern IMP1, which face each other as the second substrate 120 is bent, and a supporting member adhesive layer ADF disposed between the supporting member ADS and the second substrate 120. The supporting member adhesive layer ADF may be at least one selected from an adhesive film and an adhesive resin. Also, the supporting member adhesive layer ADF may allow the supporting member ADS to be fixed in the bent area of the second substrate 120. Thus, the bent shape of the second substrate 120 can be maintained (e.g., at least substantially maintained) by the supporting member ADS and the supporting member adhesive layer ADF.

Figure 30:
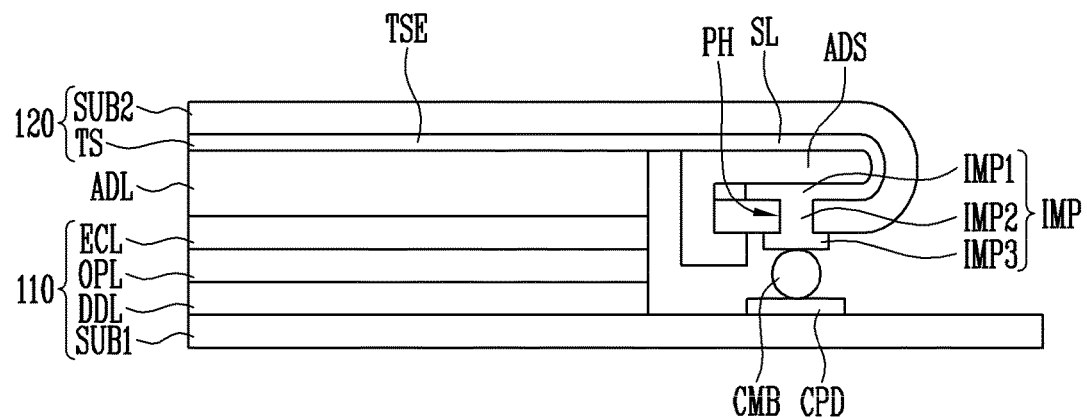

FIG. 30 is a sectional view illustrating a display device according to still another embodiment of the present disclosure.

Referring to FIGS. 1-5 and 30, the display device may include a first substrate 110, a second substrate 120 opposite to the first substrate 110, and an adhesive layer ADL joining the first substrate 110 and the second substrate 120 together.

The first substrate 110 may include a first base substrate SUB1 including a display area DA and a non-display area NDA, a driving layer DDL provided on the first base substrate SUB1, the driving layer DDL including at least one thin film transistor, an optical layer OPL provided on the driving layer DDL, the optical layer OPL including a display element connected to the thin film transistor, and an encapsulating layer ECL covering the optical layer OPL.

A connection pad unit CPDA including a connection pad CPD may be provided in the non-display area NDA on the first base substrate SUB1.

The second substrate 120 may include a second base substrate SUB2 including a sensing area SA and a non-sensing area NSA, and a touch sensor TS disposed on the second base substrate SUB2.

The touch sensor TS may include a touch sensing electrode TSE disposed in the sensing area SA, a metal pattern IMP disposed in the non-sensing area NSA, and a sensing line SL connecting the touch sensing electrode TSE and the metal pattern IMP.

The touch sensing electrode TSE and the sensing line SL may be disposed on a surface of the second base substrate SUB2, which faces the first substrate 110.

The metal pattern IMP may include a first pattern IMP1, a second pattern IMP2, and a third pattern IMP3. The first pattern IMP1 may be provided on a surface of the second base substrate SUB2, on which the touch sensing electrode TSE and the sensing line SL are disposed. Also, the first pattern IMP1 may have a shape in which the sensing line SL extends. The second pattern IMP2 may be provided in a through-hole PH passing through the second base substrate SUB2. Also, the second pattern IMP2 may connect the first pattern IMP1 and the third pattern IMP3. The third pattern IMP3 may be provided on a surface opposite to the surface of the second base substrate SUB2, on which the first pattern IMP1 is disposed.

In an embodiment of the present disclosure, a portion of the non-sensing area NSA of the second substrate 120 may be bent. If the second substrate 120 is bent, the third pattern IMP3 may be disposed opposite to the connection pad CPD of the connection pad unit CPDA.

A conductive ball CMB may be provided between the connection pad CPD and the third pattern IMP3. The first conductive ball CMB may electrically connect the third pattern IMP3 and the connection pad CPD. In this embodiment, a case where the connection pad CPD and the third pattern IMP3 are electrically connected using the conductive ball CMB has been described as an example, but the present disclosure is not limited thereto. For example, the connection pad CPD and the third pattern IMP3 may be electrically connected using a conductive adhesive layer.

In the non-sensing area NSA, there may be provided a supporting member ADS disposed between the sensing line SL and the first pattern IMP1, which face each other as the second substrate 120 is bent. A portion of the supporting member ADS may be bent, to cover an end of the second substrate 120.

FIGS. 31-34 are perspective views illustrating the bent shapes of the second substrate, disclosed in FIGS. 1-30.

Referring to FIGS. 31-34, the substrate 120 may include a flat area 120A and a bending area 120B that is in contact with the flat area 120A.

The flat area 120A may have various suitable shapes such as, for example, a closed-shape polygon including linear sides, a circle, an ellipse, etc., including curved sides, and a semicircle, a semi-ellipse, etc., including linear and curved sides. In an embodiment of the present disclosure, for convenience of illustration, a case where the flat area 120 has a polygonal shape is described as an example.

The bending area 120B may be an area in which the touch pad unit (see "TPDA" of FIGS. 3-4) in the non-sensing area (see "NSA" of FIGS. 3-4) is provided. Therefore, the flat area 120A may be an area except the bending area 120B of the second substrate 120 (e.g., the flat area 120A may exclude the bending area 120B).

Figure 31:
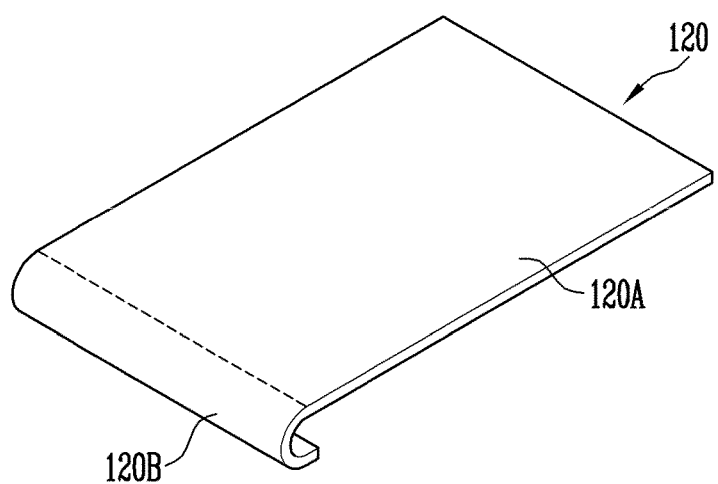
FIGS. 31-34 are perspective views illustrating bent shapes of a second substrate, disclosed in FIGS. 1-30.
Figure 32:
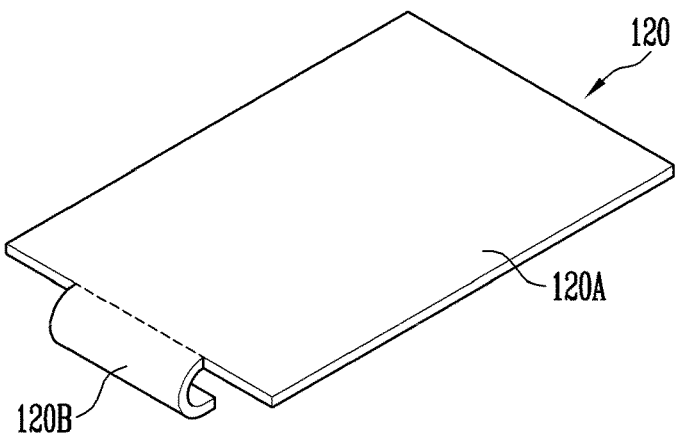
Figure 33:
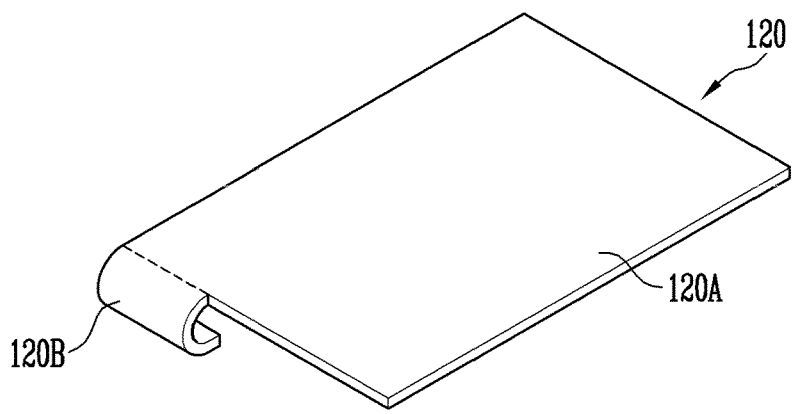
Figure 34:
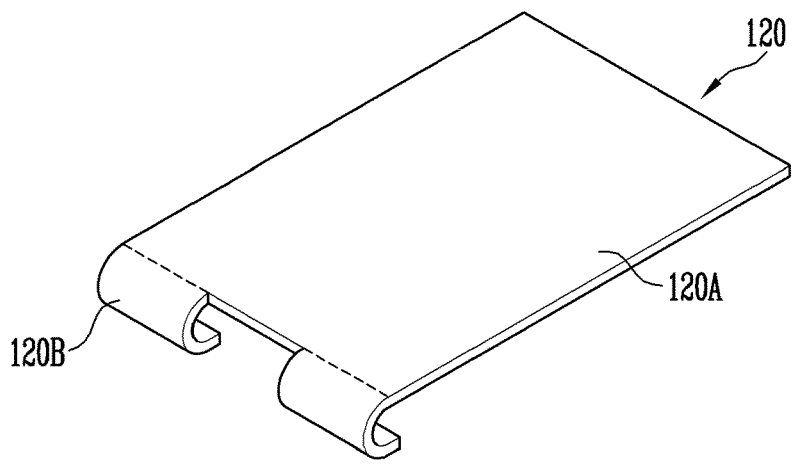

The bending area 120B may have various suitable shapes. For example, as shown in FIG. 31, the bending area 120B may have a shape extending from one side of the flat area 120A. In addition, as shown in FIGS. 32-33, the bending area 120B may have a shape extending from a portion of the one side of the flat area 120A. In addition, as shown in FIG. 34, the second substrate 120 may include two bending areas 120b spaced apart from each other. Here, the bending areas 120b may have a shape in which they extend to be spaced apart from each other at portions of the one side of the flat area 120A. Touch pad units TPDA may be provided in the bending areas 120B, respectively. For example, the second substrate 120 may include two touch pad units TPDA separated from each other.

As described above, the display device can decrease the size of the conductive ball. Thus, the display device can prevent a failure caused by a variation in size of the conductive ball (or can reduce a likelihood or degree of such a failure).

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Example embodiments have been disclosed herein, and although specific terms are employed, they are used and are to be interpreted in a generic and descriptive sense only and not for purpose of limitation. In some instances, as would be apparent to one of ordinary skill in the art as of the time of filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims, and equivalents thereof.

What is claimed is:

1. A display device comprising:
   a first substrate comprising a display area comprising a pixel area and a non-display area adjacent to the display area, the first substrate comprising a connection pad in the non-display area; and
   a second substrate facing the first substrate, the second substrate comprising a base substrate comprising a sensing area corresponding to the display area and a non-sensing area corresponding to the non-display area, and a touch sensor on the base substrate,
   wherein the touch sensor comprises a touch sensing electrode in the sensing area, a touch pad in the non-sensing area, and a sensing line electrically connecting the touch sensing electrode and the touch pad, and
   wherein the non-sensing area of the second substrate is bent such that the connection pad and the touch pad face each other.

2. The display device of claim 1, wherein the touch sensing electrode and the touch pad are on the same surface of the base substrate.

3. The display device of claim 2, further comprising a conductive ball between the connection pad and the touch pad.

4. The display device of claim 2, further comprising a protruding bump protruding toward the connection pad from the touch pad to connect the connection pad and the touch pad.

5. The display device of claim 2, further comprising a conductive adhesive layer between the connection pad and the touch pad.

6. The display device of claim 5, wherein the conductive adhesive layer comprises a conductive paste.

7. The display device of claim 2, wherein the connection pad and the touch pad are in direct contact with each other.

8. The display device of claim 1, further comprising an elastic member between areas of the second substrate, which face each other as the second substrate is bent, to maintain the bent shape of the second substrate.

9. The display device of claim 1, further comprising a polarizing layer on one surface of the second substrate.

10. The display device of claim 9, wherein the polarizing layer is on an outer surface of the second substrate.

11. The display device of claim 1, further comprising a polarizing layer between the first substrate and the second substrate.

12. The display device of claim 1, wherein a through-hole passing through the base substrate is in the non-sensing area, and
   wherein the touch pad comprises:
   a first pattern on a surface of the base substrate, on which the touch sensing electrode and the sensing line are located;
   a second pattern in the through-hole, the second pattern being connected to the first pattern; and
   a third pattern on a surface opposite to the surface of the base substrate on which the first pattern is located, the third pattern being connected to the second pattern.

13. The display device of claim 12, wherein, when the second substrate is bent, the sensing line and the first pattern face each other, and the connection pad and the third pattern face each other.

14. The display device of claim 13, further comprising a conductive ball between the connection pad and the third pattern.

15. The display device of claim 14, further comprising a conductive ball between the sensing line and the first pattern.

16. The display device of claim 14, wherein the sensing line and the first pattern are in direct contact with each other.

17. The display device of claim 13, further comprising a conductive adhesive layer between the connection pad and the third pattern.

18. The display device of claim 17, further comprising a conductive adhesive layer between the sensing line and the first pattern.

19. The display device of claim 1, wherein a through-hole passing through the base substrate is in the non-sensing area, and
wherein the touch pad comprises:
a first pattern having a shape in which the sensing line extends;
a second pattern in the through-hole, the second pattern being connected to the first pattern; and
a third pattern on a surface opposite to the surface of the base substrate on which the first pattern is located, the third pattern being connected to the second pattern.

20. The display device of claim 19, wherein, when the second substrate is bent, the connection pad and the third pattern face each other.

21. The display device of claim 20, further comprising a conductive ball between the connection pad and the third pattern.

22. The display device of claim 20, wherein the connection pad and the third pattern are in direct contact with each other.

23. The display device of claim 20, further comprising a conductive adhesive layer between the connection pad and the third pattern.

24. The display device of claim 20, wherein, when the second substrate is bent, the sensing line and the first pattern face each other, and
wherein the display device may further comprises an elastic member between the sensing line and the first pattern.

25. The display device of claim 20, wherein, when the second substrate is bent, the sensing line and the first pattern face each other, and
wherein the display device further comprises:
a supporting member between the sensing line and the first pattern; and
a supporting member adhesive layer between the sensing line and the supporting member and between the first pattern and the supporting member.

26. The display device of claim 1, wherein the touch sensing electrode and the touch pad are on different surfaces of the base substrate, respectively.

27. The display device of claim 1, further comprising a cover layer covering the touch sensing electrode and the sensing line.

28. The display device of claim 1, wherein the second substrate comprises:
a flat area; and
at least one bending area having the touch pad located therein, the at least one bending area extending from one side of the flat area to be bent.

29. The display device of claim 28, wherein the second substrate comprises two bending areas extending from the one side of the flat area, the two bending areas being spaced apart from each other.

30. A display device comprising:
a first substrate comprising a display area comprising a pixel area and a non-display area adjacent to the display area, the first substrate comprising a connection pad in the non-display area; and
a second substrate facing the first substrate, the second substrate comprising a base substrate comprising a sensing area corresponding to the display area and a non-sensing area corresponding to the non-display area, and a touch sensor on the base substrate,
wherein the touch sensor comprises a touch sensing electrode in the sensing area, a touch pad in the non-sensing area, and a sensing line electrically connecting the touch sensing electrode and the touch pad,
wherein the non-sensing area of the second substrate is bent such that the connection pad and the touch pad face each other,
wherein the touch sensing electrode and the touch pad are on different surfaces of the base substrate, respectively, and
wherein the sensing line comprises:
a first sensing line on a surface of the base substrate, on which the touch sensing electrode is located; and
a second sensing line on a surface of the base substrate, on which the touch pad is located.

31. A display device comprising:
a first substrate comprising a display area comprising a pixel area and a non-display area adjacent to the display area, the first substrate comprising a connection pad in the non-display area; and
a second substrate facing the first substrate, the second substrate comprising a base substrate comprising a sensing area corresponding to the display area and a non-sensing area corresponding to the non-display area, and a touch sensor on the base substrate,
wherein the touch sensor comprises a touch sensing electrode in the sensing area, a touch pad in the non-sensing area, and a sensing line electrically connecting the touch sensing electrode and the touch pad,
wherein the non-sensing area of the second substrate is bent such that the connection pad and the touch pad face each other,
wherein the touch sensing electrode and the touch pad are on different surfaces of the base substrate, respectively, and
wherein the sensing line comprises:
a first sensing line on a surface of the base substrate, on which the touch sensing electrode is located; and
a second sensing line on a surface of the base substrate, on which the touch pad is located,
wherein the display device further comprises a metal pattern connecting the first sensing line and the second sensing line,
wherein the metal pattern comprises:
a first pattern on a surface of the base substrate, on which the first sensing line is located;
a second pattern in a through-hole passing through the base substrate, the second pattern being connected to the first pattern; and
a third pattern on a surface of the base substrate, on which the second sensing line is located, the third pattern being connected to the second pattern.

* * * * *